US006872259B2

(12) United States Patent
Strang

(10) Patent No.: US 6,872,259 B2
(45) Date of Patent: Mar. 29, 2005

(54) METHOD OF AND APPARATUS FOR TUNABLE GAS INJECTION IN A PLASMA PROCESSING SYSTEM

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 240 days.

(21) Appl. No.: 10/252,209

(22) Filed: Sep. 23, 2002

(65) Prior Publication Data

US 2003/0019580 A1 Jan. 30, 2003

Related U.S. Application Data

(63) Continuation of application No. PCT/US01/09196, filed on Mar. 23, 2001.
(60) Provisional application No. 60/193,231, filed on Mar. 30, 2000.

(51) Int. Cl.[7] ................. C23C 16/503; C23C 16/509; C23F 1/00; H01L 21/306
(52) U.S. Cl. ................. 118/715; 118/723 I; 118/723 E; 156/345.33; 156/345.34; 156/345.43; 156/345.44; 156/345.48
(58) Field of Search .................. 118/715, 723 I; 156/345.33–345.34, 345.43–345.44

(56) References Cited

U.S. PATENT DOCUMENTS

| 3,589,394 | A | * | 6/1971 | Wanka ................. 137/520 |
| 3,610,278 | A | * | 10/1971 | Hill ..................... 137/574 |
| 4,761,269 | A | * | 8/1988 | Conger et al. ........... 118/679 |
| 4,780,169 | A | | 10/1988 | Stark et al. .......... 156/345.34 |
| 5,108,535 | A | | 4/1992 | Ono et al. ............ 156/345.33 |
| 5,174,825 | A | | 12/1992 | White, Jr. et al. ........ 118/715 |

(Continued)

FOREIGN PATENT DOCUMENTS

| EP | 62-183111 | 8/1987 |
| EP | 853 138 | 7/1998 |
| EP | 1 008 674 | 6/2000 |
| JP | 58-176196 | 10/1983 |
| JP | 2-198138 | 8/1990 |
| JP | 6-204181 | 7/1994 |
| WO | WO 99/00532 | 1/1999 |

OTHER PUBLICATIONS

"Supersonic Reactive Gas Jet Chemical Processing," IBM Technical Disclosure Bulletin, IBM, vol. 35, No. 2, Jul. 1, 1992, pp. 402–403.

*Primary Examiner*—Rudy Zervigon
(74) *Attorney, Agent, or Firm*—Pillsbury Winthrop LLP

(57) ABSTRACT

A method of and apparatus for providing tunable gas injection in a plasma processing system (10, 10'). The apparatus includes a gas injection manifold (50) having a pressurizable plenum (150) and an array of adjustable nozzle units (250), or an array of non-adjustable nozzles (502, 602), through which gas from the plenum can flow into the interior region (40) of a plasma reactor chamber (14) capable of containing a plasma (41). The adjustable nozzle units include a nozzle plug (160) arranged within a nozzle bore (166). A variety of different nozzle units are disclosed. The nozzle plugs are axially translatable to adjust the flow of gas therethrough. In one embodiment, the nozzle plugs are attached to a plug plate (154), which is displacable relative to an injection plate (124) via displacement actuators (170) connecting the two plates. The displacement actuators are controlled by a displacement actuator control unit (180), which is in electronic communication with a plasma processing system control unit (80). The gas flow into the chamber interior region is preferably controlled by monitoring the pressure in the plenum and in the chamber and adjusting the nozzle units accordingly. Where the nozzle units are not adjustable, a portion of the nozzles are sized to a first flow condition, and another portion of the nozzles are sized to a second flow condition.

49 Claims, 15 Drawing Sheets

U.S. PATENT DOCUMENTS

| | | |
|---|---|---|
| 5,269,847 A | 12/1993 | Anderson et al. ............ 118/715 |
| 5,286,331 A | 2/1994 | Chen et al. ............. 156/345.39 |
| 5,496,408 A * | 3/1996 | Motoda et al. .............. 118/715 |
| 5,589,110 A * | 12/1996 | Motoda et al. ................. 261/61 |
| 5,683,517 A | 11/1997 | Shan ...................... 118/723 E |
| 5,728,223 A * | 3/1998 | Murakami et al. ........... 118/715 |
| 5,746,875 A | 5/1998 | Maydan et al. ......... 156/345.34 |
| 5,853,484 A | 12/1998 | Jeong .......................... 118/715 |
| 5,885,358 A | 3/1999 | Maydan et al. ......... 118/723 R |
| 6,286,454 B1 * | 9/2001 | Hirayama et al. .. 118/723 MW |
| 6,315,858 B1 * | 11/2001 | Shinozuka et al. ..... 156/345.33 |
| 6,446,573 B2 * | 9/2002 | Hirayama et al. .. 118/723 MW |
| 2003/0000469 A1 * | 1/2003 | Pyo ............................. 118/715 |
| 2003/0019580 A1 * | 1/2003 | Strang ................... 156/345.33 |

\* cited by examiner

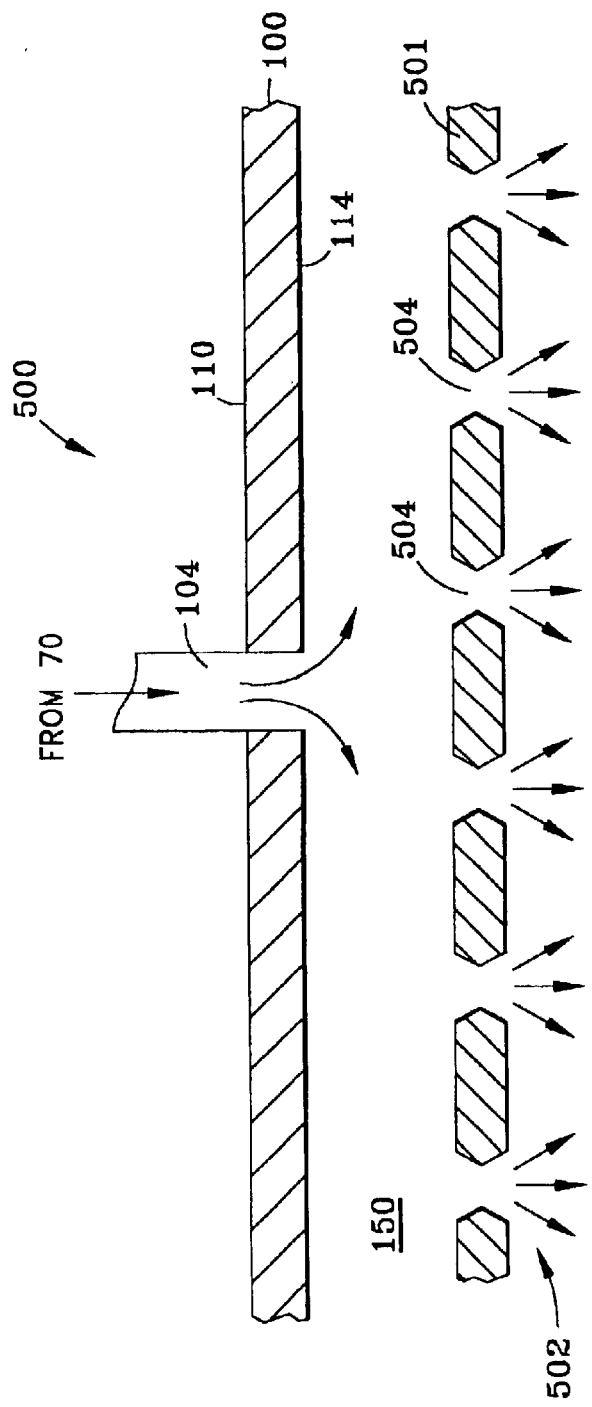
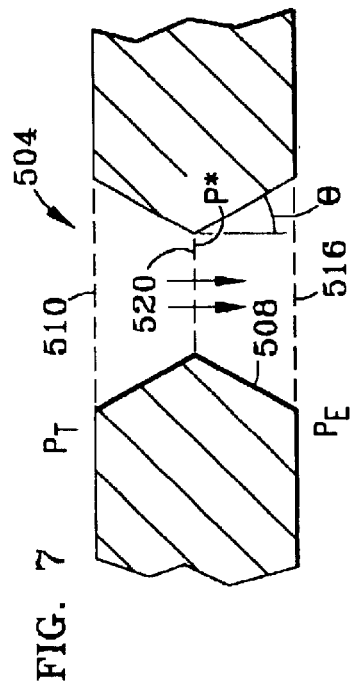

METHOD OF AND APPARATUS FOR TUNABLE GAS INJECTION IN A PLASMA PROCESSING SYSTEM

This is a continuation of International Application No. PCT/US01/09196 which was filed on Mar. 23, 2001, and also claims benefit of U.S. application Ser. No. 60/193,231, filed Mar. 30, 2000, the contents of both of which are incorporated herein in their entirety.

FIELD OF THE INVENTION

The present invention relates to plasma processing systems, and in particular, to methods of and apparatus for providing tunable gas injection in such systems.

BACKGROUND OF THE INVENTION

One of the key factors that affects the throughput of the fabrication of integrated circuits (IC) is the etch rate and/or deposition rate. In particular, as critical dimensions continue to decrease and respective aspect ratios of various features, such as self align contacts, etc., continue to increase, the ability to transport etch reactants and/or deposition materials to (and remove etch products from) the bottom of high aspect ratio (HAR) vias and contacts becomes inherently more difficult. This is primarily due to the lack of directionality of the neutral flow. For example, in etch applications, an improved method of transporting etch reactants to the bottom of high aspect ratio self align contacts (HAR SAC) is imperative for the continuance of the technology. A second key factor that contributes to the quality of the IC fabrication process is the process selectivity. For example, in a particular etch application, it is desirable to etch one identified material at a rate substantially greater than any other material present (such as the photo-resist mask, etc.). A third key factor that determines the yield and overall quality of an IC is the uniformity of the semiconductor fabrication processes (e.g., film etch and/or deposition), occurring at the surface of a substrate. In wafer processing systems, the rate, selectivity and uniformity of the deposition or removal of material is governed by the design of the overall reactor. A key element in this overall system design that can contribute to the aforementioned key factors for successful IC fabrication is the design of the gas delivery system and, in particular, the gas nozzles used to deliver gas to the interior of the plasma reactor chamber.

One system for processing ICs on semiconductor substrates typically includes a vacuum chamber, a pedestal for supporting the wafer in the chamber, a RF power generator for coupling RF power to a plasma within the vacuum chamber and a gas injection system for supplying gases to the chamber. If the reactor is an inductively coupled reactor, then it can include a coil antenna around the chamber connected to the plasma RF power source. Conversely, if the reactor is a capacitively coupled reactor, then it can include an additional parallel plate electrode facing the substrate that is connected to the plasma RF power source. Moreover, the wafer pedestal can also be connected to either the same or a separate RF power source. In other types of plasma reactors, there may be no coil antenna or opposite facing parallel electrode, and the plasma RF power source is connected solely to the wafer pedestal. Additional plasma sources may include an electron-cyclotron-resonance (ECR) source wherein microwave power is coupled to the plasma. In any case, the gas injection system of the reactor has one or more gas distribution apparatus. If multiple gas distribution apparatus are employed, each is typically disposed in a separate part of the reactor so as to provide gas to a different region within the chamber.

The gas distribution apparatus utilized depends on the particular requirements of the process being performed. In general, the gaseous specie(s) enter the vacuum chamber through a "showerhead" gas injection plate that comprises a plurality of small orifices (bores). The bores are typically constant area circular ducts that are typically 0.5 to 1 mm in diameter. A single injection plate may comprise several hundred to several thousand bores. Due to the effusive nature of the gas introduction, two distinct features of the flow through these bores include very low "bulk" velocities in a particular direction (i.e., gas molecules do not move collectively in a preferred direction at high velocities) and an overall lack of directivity. In essence, the gas "showers" down onto the substrate surface.

In order to achieve improved process uniformity, it is sometimes necessary to adjust the spatial distribution of the inlet mass flow and/or gas specie(s) to adjust the resultant neutral flow pressure field and flow dynamics in conjunction with other process parameters (i.e., RF field) to compensate for the inherent non-uniformity. In the prior art, most methods of adjusting the mass flow distribution typically fall into one of the following two categories: a) the adjustment of the spatial distribution of the bore area or the number density of the bore, hence, adjustment of A, or b) the adjustment of the bore mass flux or $\rho V$. As stated above, the first method comprises a spatial distribution of the bore area or number density of bores. Several patents address the first method, including U.S. Pat. No. 4,780,169 and several patents filed within the Japanese Patent Office, including Japanese Patent Applications No. 2-198138, 6-204181, and 60-46029.

However, there are disadvantages to the first method. For example, a separate injection plate must be machined for each distribution tested, and it cannot be adjusted without breaking the vacuum or low pressure environment. With regard to the second method, U.S. Pat. No. 5,683,517 discloses a method of using a programmable gas flow divider to adjust the distribution of the mass flux to individual bores or clusters of bores. Other U.S. patents include U.S. Pat. Nos. 5,853,484 and 5,269,847. Each of these inventions includes adjustment of the mass flux to a plurality of sub-bores and all include the capability for in-situ adjustment of the mass flow distribution. However, the design can produce fairly complex and expensive plumbing arrangements for gas injection.

A second type of gas distribution apparatus comprises radial injection of the gas into the chamber from the reactor's sidewall, typically near the level of the wafer, during various processing operations (e.g., plasma enhanced chemical vapor deposition). This radial gas distribution apparatus may be used alone, or in combination with other gas distribution apparatuses, i.e., the so-called showerhead type of gas delivery nozzle mentioned above. In either of the two above described apparatuses, the gas injection lacks directivity, in particular, in a direction normal to the substrate surface. This inhibits neutral atom/molecule/radical deposition in deep, high aspect ratio trenches or vias when fabricating ICs.

One method of generating highly directive gas jets is to use properly designed gas nozzles to restrain the rate of gas expansion as a gas is expanded from a region of high pressure to a region of low pressure and accelerated towards the substrate. The prior art discloses gas nozzles for use in semiconductor tools such as plasma reactors. For example, U.S. Pat. No. 5,885,358 (the '358 patent) describes a gas injection system for injecting gases into a plasma reactor. The reactor has a vacuum chamber with a sidewall, a pedestal for holding a semiconductor wafer to be processed, and a RF power applicator for applying RF power into the chamber. The gas injection system includes at least one gas supply containing gas, a gas distribution apparatus having at least one slotted aperture facing the interior of the chamber, and one or more gas feed lines connecting the gas supply or supplies to the gas distribution apparatus. A preferred embodiment of a radial gas distribution apparatus is disposed in the chamber sidewall and includes plural gas distribution nozzles each with a slotted aperture facing an interior of the chamber. Gas feed lines are employed to respectively connect each gas distribution nozzle to separate ones of the gas supplies. However, a shortcoming of this system is that the gas is not optimally directed at the wafer surface, so as to enhance the statistical probability of gas atoms or molecules approaching the substrate at normal incidence to the substrate surface. Moreover, the system does not address the means by which the gas is introduced or expanded through the nozzle to achieve a directed gas flow nor does it even attempt to discuss the ability to tune the directivity of the gas injection.

U.S. Pat. No. 5,746,875 describes an invention that is embodied in a gas injection apparatus for injecting gases into a plasma reactor vacuum chamber having a chamber housing, a pedestal holding a workpiece to be processed, a device for applying RF energy into the chamber, the gas injection apparatus having a gas supply containing an etchant species in a gas, an opening in the chamber housing, a gas distribution apparatus disposed within the opening in the chamber housing which has at least one slotted aperture facing the interior of the chamber and a device for controlling the flow rate of gas from the one or more slotted apertures, and a gas feed line from the supply to the gas distribution apparatus. In a preferred embodiment, the gas distribution apparatus includes a center member surrounded by at least one annular member with a gap therebetween comprising the slotted aperture. Preferably, each of the members of the gas distribution apparatus comprises a material at least nearly impervious to attack from the etchant species. In one example, each of the members of the gas distribution apparatus comprises one of a ceramic, fused quartz, polymeric or anodized aluminum material and the gas feed line comprises stainless steel. Preferably, each of the members has its surface polished prior to assembly of the gas distribution apparatus. However, as before with the '358 patent, a shortcoming of this system is that the gas is not optimally directed at the wafer surface, so as to enhance the statistical probability of gas atoms or molecules approaching the substrate at normal incidence to the substrate surface. Moreover, the system does not address the means by which the gas is introduced or expanded through the nozzle to achieve a directed gas flow nor does it discuss the ability to tune the directivity of the gas injection.

U.S. Pat. No. 5,286,331 (the '331 patent) describes how in supersonic molecular beam etching, the reactivity of the etchant gas and substrate surface is improved by creating etchant gas molecules with high internal energies through chemical reactions of precursor molecules, forming clusters of etchant gas molecules in a reaction chamber, expanding the etchant gas molecules and clusters of etchant gas molecules through a nozzle into a vacuum, and directing the molecules and clusters of molecules onto a substrate. Translational energy of the molecules and clusters of molecules can be improved by seeding with inert gas molecules. The process provides improved controllability, surface purity, etch selectivity and anisotropy. Etchant molecules may also be expanded directly (without reaction in a chamber) to produce clusters whose translational energy can be increased through expansion with a seeding gas. However, the shortcomings of this system are several fold. First, the invention uses a single gas injection nozzle to expand a gas into an ultra-high vacuum (that ranges in chamber pressures of $10^{-8}$ to $10^{-14}$ Torr and less) to produce a supersonic molecular beam employed for neutral beam etching. Secondly, the design of the nozzle system includes a skimmer which would cause significant interference to the flow through the skimmer at chamber pressures above approximately 10 mTorr. Moreover, conventional pumping technology could not evacuate the chamber to the above-cited pressure for a number of nozzles necessary to produce a uniform process.

U.S. Pat. No. 5,108,535 describes a dry etching apparatus which includes a discharge room in which a gas plasma is created by a discharge, an ejection nozzle for ejecting the plasma gas, a first vacuum room into which the plasma gas is introduced through the ejecting nozzle by supersonic expansion of the plasma gas, and a second vacuum room including a skimmer for extracting a supersonic molecular flow, the supersonic molecular flow of the plasma gas taken into the second vacuum room being blown against the material to be etched. However, similar to the application described in the '331 patent, many of the same shortcomings are inherent to such a system designed for neutral beam etching.

To further understand the benefits of the design of the gas flow manifold of the present invention, it helps to understand the concept of choking for a continuum, isentropic gas flow and designing a nozzle unit to produce a supersonic gas jet. With reference to FIG. 1, there is shown a conventional Laval convergent-divergent nozzle 800 comprising an hourglass cross-sectional shaped bore having a gas entrance region 810, a centrally located narrow throat region 820 and a gas exit region 830. Also, the gas entrance total pressure is $P_t$, the throat pressure is $P^*$, the gas exit pressure is $P_e$ and the plasma reactor chamber pressure in region 840 is $P_c$.

When nozzle 800 becomes choked, the Mach number M (the ratio of the local velocity to the speed of sound) is unity at nozzle throat 820. Once the flow of gas is sonic at the throat 820, it accelerates to supersonic speeds (M>1) when it experiences an increase in area (unlike a subsonic flow that decelerates during an area enlargement). Under such a condition, a nozzle with diverging walls after the throat accelerates the flow to supersonic speeds. Once the flow becomes supersonic, the flow characteristics (as defined by rays of pressure wave propagation) become real and are identifiable as Mach waves (expansion) and shock waves (compression). The directions of propagation of such waves are limited to a domain of influence, wherein a point within the entire domain can only affect the region that is downstream of that point and bounded by the left and right running characteristics that intersect at that point. Therefore, when M>1, pressure waves can not propagate back upstream through the nozzle and influence the incoming flow, i.e., volume flow rate or mass flow rate (when the gas entrance total pressure Pt is held fixed).

For a nozzle with a constant cross-sectional area (i.e., a straight cylindrical bore), the gas exit pressure Pe may be larger (even substantially larger, by several orders of magnitude) than the ambient chamber pressure Pc. In fact, when a divergent nozzle section is employed, it may produce either an under-expanded gas (i.e., one that has not entirely expanded to the chamber pressure) or an over-expanded gas (i.e., one that has expanded beyond the chamber pressure)

condition. The latter condition generally results in a strong normal shock in the gas nozzle. Alternatively, in the under-expanded case, the gas exiting the bore freely expands in to the vacuum chamber. However, expansion waves reflecting from the wall adjacent to the exit of the bore opening coalesce to form a barrel shock which, in turn, creates a Mach disk a short distance downstream from the bore exit plane (depending upon the pressure ratio Pt/Pc it may be of order 10 nozzle diameters for a pressure ratio of order 100 to 200). Only by careful design of the area ratio and the nozzle contour can one achieve a pressure-matched condition comprising a collimated, uniform gas flow.

For most plasma reactor system applications, the low pressure environment of chamber interior region 840 of a plasma reactor chamber into which the gas is injected, is typically in the range between $1<P_c<1000$ mTorr. Likewise, the gas entrance total pressure $P_t$ is typically in the range between $0.1<P_t<100$ Torr. Across these pressure ranges, the gas dynamics can change significantly due to the dependence of the Knudsen number (Kn) on the local pressure, and moreover, the resultant transition from a continuum flow to a free molecular flow (a consequence of the relatively large Kn). By definition, the Knudsen number is a non-dimensional parameter relating the mean-free path for gas atom (or molecule) collisions to a characteristic length scale for the flow. In the present invention, the appropriate length scale is the diameter of the nozzle, or alternatively, the axial length along which macroscopic properties of the flow vary significantly.

At the upper bound of the pressures previously mentioned ($P_t>\sim10$–$100$ Torr), the gas flow through a nozzle having a bore diameter of approximately of the order 0.5 mm undergoes a sufficient number of collisions that the gas flow behaves as a continuum fluid; i.e., the mean free path of the atoms or molecules is much smaller than the characteristic flow length scales, or $Kn<<1$. Furthermore, the Knudsen number is sufficiently small (and the Reynolds number is sufficiently large) that a region of the continuum nozzle flow may be regarded as isentropic. During these conditions, the gas nozzle behaves similarly to the description provided above.

However, for pressure-matched conditions at gas exit region 830, for low-pressure applications, it is conceivable to observe transition flow effects due to the increase of Kn through nozzle 800. For example, as the gas expands with the area enlargement, the pressure decreases and Kn increases; i.e., the mean free path between gas atom (or gas molecule) collisions becomes large to the point that it becomes comparable to the nozzle characteristic length scale. In general, Kn will enter the transition regime (i.e., $0.01<Kn<1$) and the gas may emanate from nozzle 800 as a free molecular flow. This phenomenon can be beneficial to the gas acceleration, since the mean free path at nozzle exit region 830 has become larger than scales across which shock waves may occur.

Midway through the pressure range mentioned above ($0.5<P_t<5$–$10$ Torr), viscosity plays a growing role in the gas flow through nozzle 800. Ultimately, there exists no region within the flow field that may be treated as isentropic, continuum fluid. Across approximately this range of pressure, the gas flow through the nozzle transitions to an effusive molecular flow. At lower pressures, gas/molecular collisions taking place within nozzle 800 will become more infrequent to the extent that the gas flow may exhibit the behavior of a free molecular flow (and no longer can macroscopic properties in the continuum sense adequately describe the behavior of the flow).

Accordingly, when higher mass flow rates are achieved, one can attain a higher source total pressure, i.e., a mass flow rate of 500 to 1000 sccm and greater. An advantage to operating under these conditions in semiconductor processing is that highly directive gas jets can be produced that may be organized to coalesce prior to impinging on a substrate being processed. Furthermore, the gas jets may be designed to transition to a free molecular flow at the gas exit region 830. In so doing, the expanding gas becomes a supersonic beam (that undergoes few collisions), with a direction predominantly normal to the substrate plane. Both experimental measurements and theoretical predictions (i.e., Direct Simulation Monte Carlo, DSMC) can be employed to analyze the transition of the continuum flow to the behavior of a free molecular flow.

BRIEF SUMMARY OF THE INVENTION

The present invention relates to plasma processing systems, and in particular, to methods of and apparatus for providing tunable gas injection in such systems.

The present invention is an apparatus and a method that enables the supersonic expansion of gases through arrays of specially designed "tunable" nozzles capable of adjusting the internal gas flow within the nozzle to adjust the nozzle gas exit pressure relative to the ambient chamber pressure. Part of the gas nozzle structure allows the position of the nozzle plug to be translated through a nozzle bore along the common axis, thus providing a way of controlling the gas expansion through the nozzle. In doing so, an under-expanded, over-expanded or a pressure matched condition at the nozzle exit can be achieved. The aforementioned conditions correspond to a diverging gas jet, a converging gas jet or a collimated gas jet at the nozzle exit, respectively.

The present invention is also an apparatus and a method that enables the adjustment of the mass flow rate through a bore or cluster of bores relative to another bore or cluster of bores, wherein a plurality of bores or plurality of clusters of bores form an array of bores for gas injection. The position of the nozzle plug may be adjusted in order to alter the minimum area (or nozzle throat area) and, in turn, alter the mass flow rate.

The present invention is also an apparatus and a method that enables both the adjustment of the gas expansion and the mass flow rate of gases through arrays of specially designed "tunable" or "adjustable" nozzles. Moreover, a gas injection system is presented that is capable of affecting the gas properties proximate to different regions over the substrate.

Accordingly, a first aspect of the invention is a gas injection manifold apparatus for adjustably controlling the flow of gas in a plasma processing apparatus. The apparatus comprises a backplate with at least one through aperture formed therein; the aperture having an upper surface, a lower surface, and first and second ends. Arranged adjacent the backplate and substantially parallel thereto is a plug plate having upper and lower surfaces. The plug plate includes a plurality of spaced apart through bores and a corresponding plurality of nozzle plugs extending from the lower surface of the plug plate. The apparatus further includes an inject plate having upper and lower surfaces and first and second ends. The inject plate is arranged adjacent the plug plate lower surface and is movably spaced apart therefrom by displacement actuators. The inject plate has a plurality of through bores each with a bore central axis. The inject plate is connected to the backplate via connecting members. The inject plate is arranged so that the nozzle plugs movably extend within respective through bores along the bore central axes, thereby forming a plurality of adjustable nozzle units each having a gas entrance region, a throat, and a gas exit region. Various preferred embodiments of suitable nozzle units are described in detail below. The backplate lower surface, the inject plate upper surface and the connecting members define a pressurizable plenum into which a process gas is fed. Further, the displacement actuators are adjustable so as alter the location and size of the throat within the through bores to adjust the flow of gas from the pressurizable plenm through the nozzle units and into a process chamber.

A second aspect of the invention is a plasma processing system having the injection manifold described above.

A third aspect of the invention is a method of processing a wafer in a plasma reactor system having a chamber with an interior region capable of supporting a plasma. The method comprises the steps of first, providing a gas injection manifold having a plurality of adjustable nozzle units capable of controlling the flow of gas therethrough, arranged adjacent the wafer. The next step is flowing gas into said gas injection manifold. The final step is adjusting the flow of gas from the injection manifold into the chamber interior region and toward the wafer by adjusting one or more of the nozzle units so that the gas flow condition from the one or more adjusted nozzle units is one of pressure-matched, underexpanded and over-expanded.

BRIEF DESCRIPTION OF THE SEVERAL VIEWS OF THE DRAWING

FIG. 6 is a cross-sectional schematic diagram of a gas injection manifold of the present invention, which includes a nozzle array plate having a nozzle array formed therein, wherein the nozzles in the nozzle array have a convergent-divergent double-conic cross-section;

FIG. 7 is a cross-sectional close-up schematic diagram of a nozzle of the gas injection manifold of FIG. 6;

DETAILED DESCRIPTION OF THE INVENTION

The present invention relates to plasma processing systems, and in particular, to methods of and apparatus for providing tunable gas injection in such systems.

It has been found that, in the processing of wafers in the fabrication of semiconductor devices, deviations of the gas molecule directionality from normal incidence with respect to the wafer surface decrease the quality of high aspect ratio processes performed when forming ICs. It has also been found that increased gas speed and a high degree of directionality of the gas flow improves the quality of both etch and deposition of material within deep, high aspect ratio trenches or vias used in the formation of ICs.

Figure 2A:
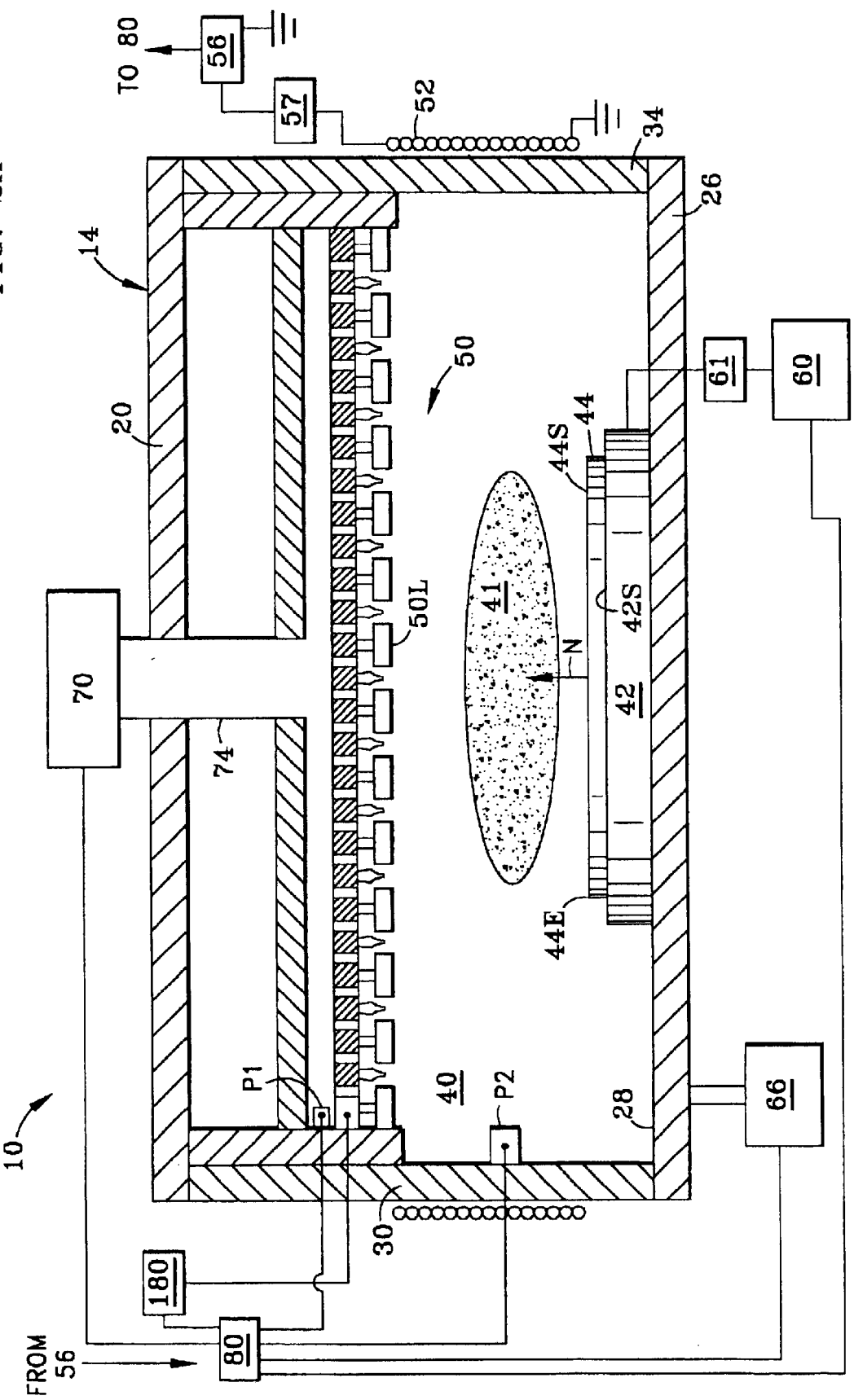
FIG. 2A is a schematic cross-sectional diagram of an inductively coupled plasma reactor system according to the present invention.

With reference now to FIG. 2A, an inductively coupled plasma (ICP) reactor system 10 of the present invention comprises a plasma reactor chamber 14 having an upper wall 20, a lower wall 26 with an inner surface 28, sidewalls 30 and 34, and a chamber interior region 40 capable of containing a plasma 41. System 10 also includes a wafer pedestal 42 having a pedestal surface 42S for supporting a semiconductor wafer 44 having a surface 44S to be processed. System 10 further includes a gas injection manifold 50 with a substantially planar lower surface 50L, the manifold being arranged within interior region 40 with planar lower surface 50L substantially parallel to pedestal surface 42S. The design and operation of gas injection manifold 50 is described in greater detail below. Associated with gas injection manifold 50 is an actuator control unit 180 operatively connected thereto, also discussed in greater detail below.

For an inductively driven system 10, the system includes a RF coil antenna 52 wrapped around reactor chamber 14 and electrically connected to a RF source 56 through a match network 57 for the general purpose of initiating and maintaining a plasma. Further included in system 10 is a RF power source 60 electrically connected to wafer pedestal 42 through a match network 61 for the general purpose of biasing wafer 44. However, other power source configurations may be employed. For example, inductive coil antenna 52 may be a quarter-wave or half-wave helical resonator wherein the coil is grounded at one end, open at the opposite end and connected to the RF generator through a match network near the grounded end. Also, system 10 may be a capacitively coupled system wherein the gas injection manifold 50 is housed within the upper electrode and wafer pedestal 42 serves as the lower electrode, the lower and upper electrodes representing a parallel plate discharge reactor. Each electrode may be driven from a separate RF generator through an independent match network to be illustrated below.

System 10 also includes a vacuum pumping system 66 and throttle valve (not shown) to control the gas pressure in chamber interior region 40. In addition, system 10 includes a gas supply system 70 in pneumatic communication with gas injection manifold 50 through a gas supply line 74. Gas supply system 70 supplies gases such as Ar, He, $H_2$, $O_2$, $Cl_2$, $CF_4$, $C_4F_8$, $SF_6$, etc. (or mixtures thereof) to be used in processing wafer 44. Further, system 10 includes a control unit 80 electrically connected to gas supply system 70, RF power source 56, RF power source 60, actuator control unit 180, and vacuum pumping system 66, for controlling the overall operation of system 10.

Figure 2B:
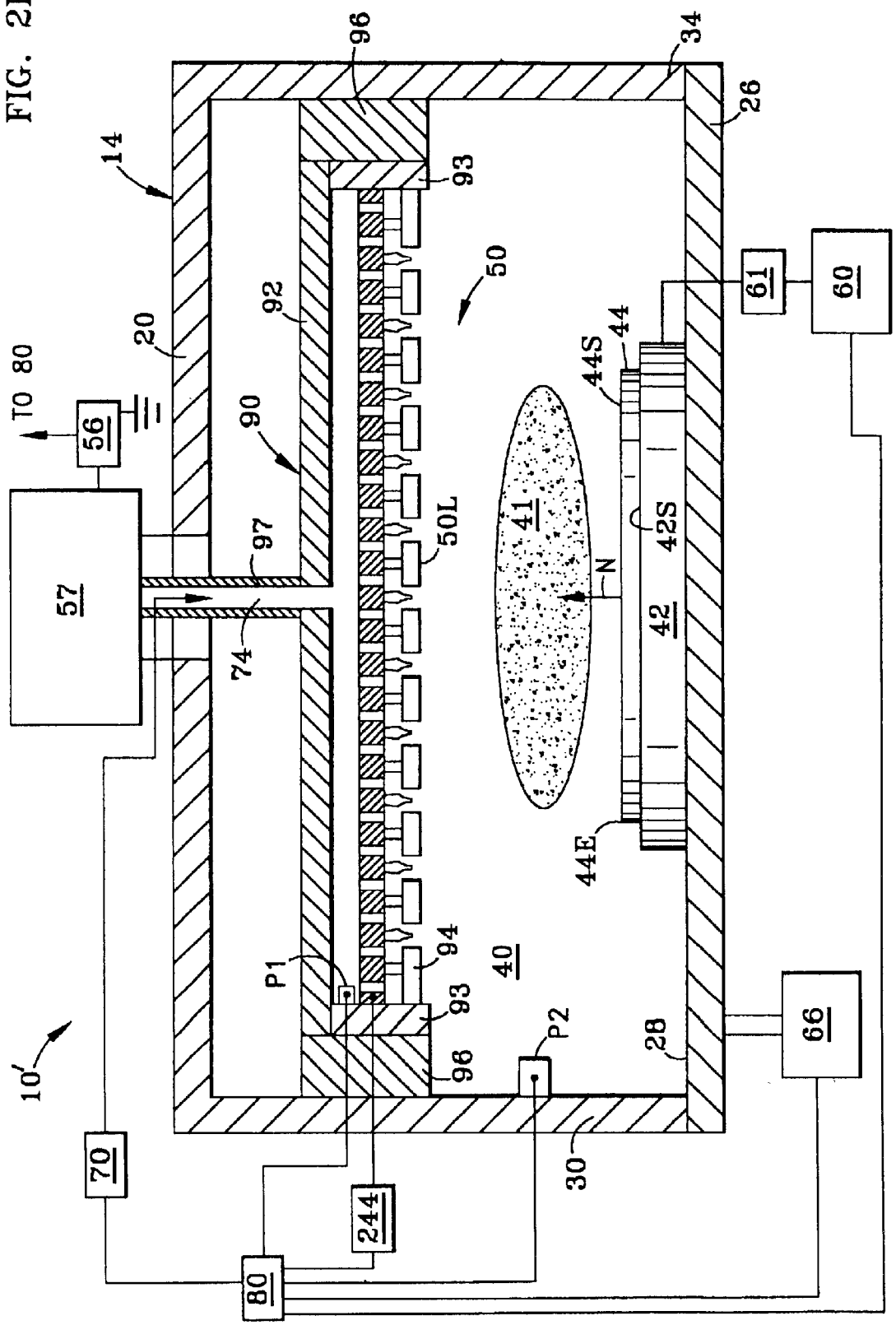
FIG. 2B is a schematic cross-sectional diagram of a capacitively coupled plasma reactor system according to the present invention.

With reference to FIG. 2B, a capacitively coupled plasma (CCP) reactor system 10' includes many of the same elements as inductively driven system 10 of FIG. 2A, but does not include inductive coil antenna 52. Rather, system 10' includes an upper electrode assembly 90 which is nominally planar, with lower surface 50L substantially parallel with the lower electrode or wafer pedestal 42 upper surface 42S (and wafer surface 44S). Upper electrode assembly 90 comprises an upper conducting planar member 90, conducting sides 93 a lower conducting planar member 94, and dielectric (insulating) members 96 arranged between conducting sides 93 and chamber sidewalls 34. Upper electrode assembly 90 houses gas injection system 50. RF power is delivered to upper electrode 90 from RF generator 56, through match network 57 via a RF transmission feed 97. As in system 10, gas from gas supply system 70 is introduced into upper electrode 90 through gas conduit 74. Upper electrode 90 and wafer pedestal 42, which in system 10' serves as a lower electrode, constitute parallel plate electrodes for a capacitive discharge reactor.

Tunable Gas Injection Manifold

Figure 3A:
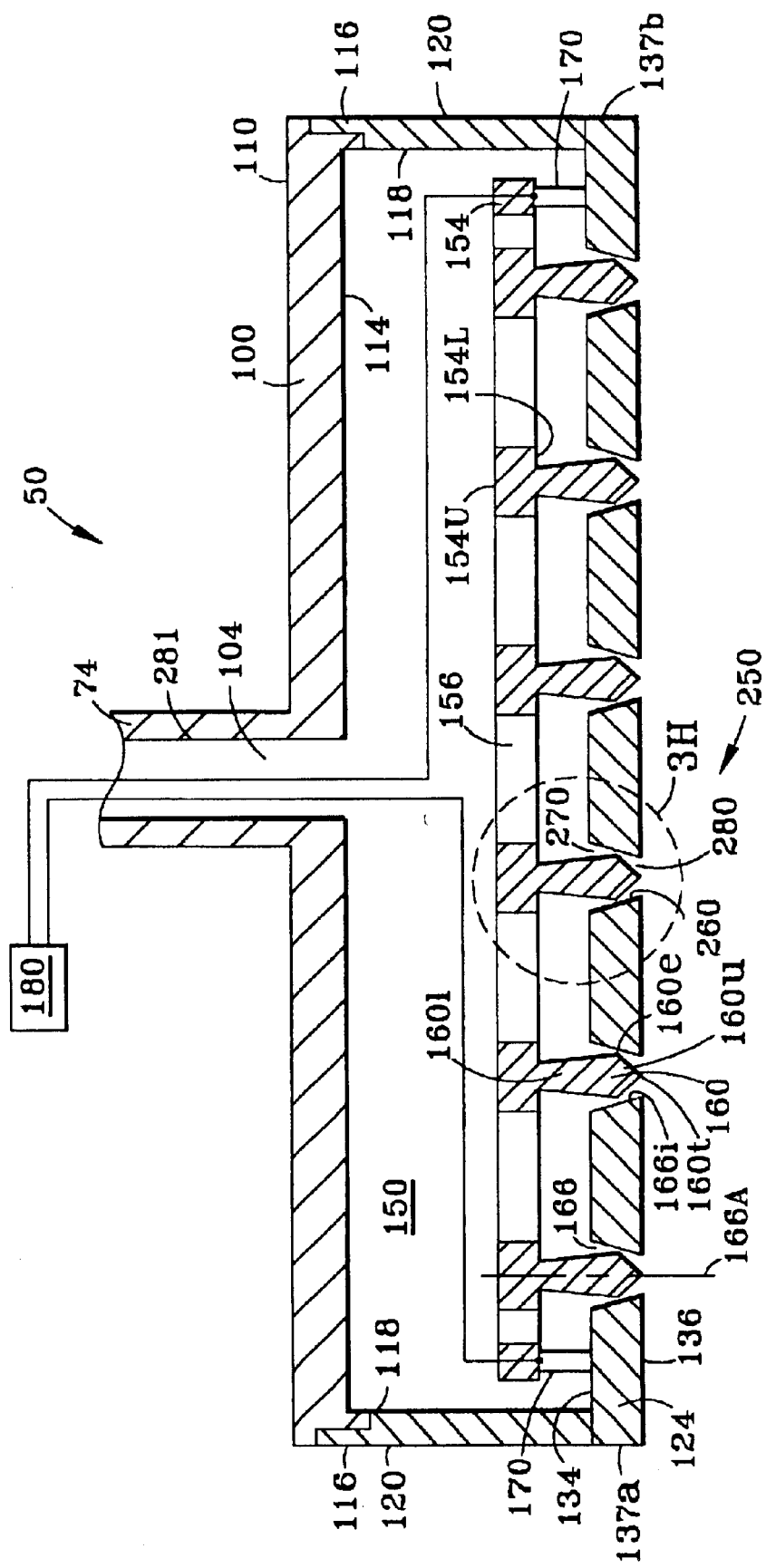
FIG. 3A is a schematic cross-sectional diagram of a gas injection manifold according to a first embodiment of the present invention, including an actuator control unit.

With reference now to FIG. 3A, the design and operation of gas injection manifold 50 according to a first embodiment is now described in more detail. Gas injection manifold 50 comprises a back plate 100 having a central aperture 104, an upper surface 110 and a lower surface 114, cylindrical end wall 116 having an inner cylindrical surface 118 and outer cylindrical surface 120, and inject plate 124 having a plurality of either straight-walled or contoured bores 166, an upper surface 134, a lower surface 136 and ends 137a and 137b. Lower surface 114 of the back plate 100 is nominally parallel with the upper surface 134 of the inject plate 124, while the inner cylindrical surface 118 of the cylindrical end wall 116 define a center axis that is nominally perpendicular to both surfaces 114 and 134. Note that although the present embodiment describes a cylindrical system, there are no limitations for extension to a rectangular system or other multi-sided system. Inner cylindrical surface 118 of cylindrical end wall 116 (which serves as a connecting member for the plug plate and the inject plate), lower surface 114 of back plate 100 and upper surface 134 of inject plate 124 together define a pressurizable volume (plenum) 150. In a preferred embodiment, back plate 100, wall 116 and inject plate 124 constitute a unitary structure.

Within plenum 150, gas injection manifold 50 further includes a freely moving plug plate 154 arranged parallel to and spaced apart from back plate 100 and inject plate 124. Plug plate 154 has an upper surface 154U and a lower surface 154L, with upper surface 154U facing lower surface 114 of backplate 100, and lower surface 154L facing upper surface 134 of inject plate 124. Plug plate 154 is nominally a flat plate comprising a plurality of large apertures 156 through which gas may pass, and a plurality of nozzle plugs 160 each having a base or lower portion 160l, and an upper portion 160u with a tip 160t, and an edge portion 160e between the lower and upper portions. Each nozzle plug 160 extends into a respective bore 166 formed in inject plate 124. Each bore 166 has an interior surface 166i and bore axis 166A.

In the present embodiment, plug plate 154 serves the primary purpose of connecting all nozzle plugs 160 to a common, rigid medium that, when translated relative to inject plate 124, translates all nozzle plugs the same amount, while being sufficiently porous to not hinder the movement of gas in plenum 150 (i.e., the pressure is equilibrated throughout plenum 150).

In a preferred embodiment, lower surface 154L of plug plate 154 is movably connected to upper surface 134 of inject plate 124 via displacement actuators 170. Displacement actuators 170 are each electronically connected to an actuator control unit 180 that activates and controls the operation of the displacement actuators via electronic signals.

A preferred embodiment of the present invention uses piezoelectric transducers as displacement actuators 170. However, other known actuators can also be used. For example, mechanical devices such as a stepper motor driving a threaded lead screw through the plate, or pneumatic or hydraulic devices can be used. However, piezoelectric actuators are preferred because of their compact size, rapid response rate and minimal particulate contamination to the process. Inject plate 124 is arranged so that nozzle plugs 160 can movably extend, via activation of displacement actuators 170, into respective bores 166. Nozzle plugs 160 are preferably centrally aligned within bores 166 along bore central axis 166A.

When all nozzle plugs are attached to a single plug plate having a diameter of the order of the diameter of the inject plate (typically, the inject plate diameter is greater than the substrate diameter by 20% to 50%), three displacement actuators, equispaced around the periphery of the plug plate, would be desired. Due to the rigidity of the plug plate, two actuators displaced azimuthally by 180 degrees may be sufficient. For smaller plug plates, and even individual nozzle plugs, one displacement actuator per plate or plug may be sufficient.

Figure 3B:
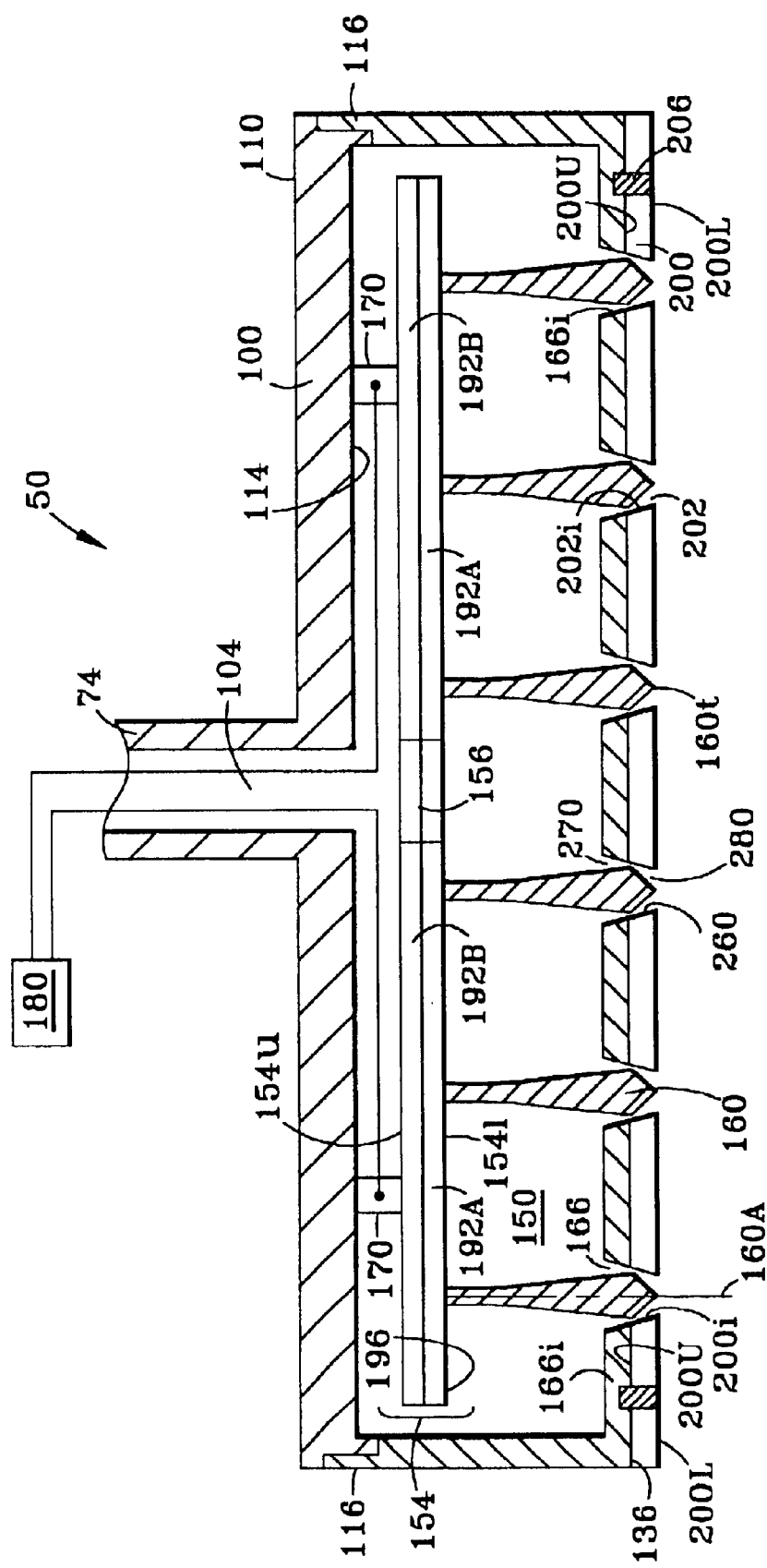
FIG. 3B is a schematic cross-sectional diagram of a gas injection manifold according to a second embodiment of the present invention, showing an actuator control unit electronically connected to displacement actuators in the manifold.

With reference to FIG. 3B, in a second embodiment, upper surface 154U of plug plate 154 is movably connected to lower surface 114 of back plate 100. Moreover, plug plate 154 comprises two plate members 192A and 192B. In the present embodiment, instead of a plurality of large apertures 156, only a single aperture 156 is required to allow for the passage of gas through gas feed 104 into plenum 150. The reason for breaking up plug plate 154 into two plate members 192A and 192B is so that the plug plate can be made of two different materials. Additionally, plate 192A, which interfaces with plenum 150 and which is closest to the plasma is made of a material that is compatible with the plasma process, such as silicon for silicon processing, silicon carbide, etc. Moreover, nozzle plugs 160 may be made of aluminum with hard anodized surfaces. In the present embodiment of the present invention, plate member 192A can be readily replaced without disrupting displacement actuators 170.

With continuing reference to FIG. 3B, a second inject plate 200 is attached to lower surface 136 of (first) inject plate 124. Second inject plate 200 comprises an upper surface 200U, a lower surface 200L and bores 202, the latter of which are preferably aligned with bores 166 of inject plate 124. Bores 202 may be straight, tapered or contoured bores to match the shape of bores 166. Second inject plate 200 is fixed to first inject plate 124 (e.g., by screws 206) such that upper surface 200U of second inject plate 200 is pressed against lower surface 136 of first inject plate 124. In this manner, the primary surfaces in contact with plasma 41 (see FIGS. 2A, 2B) are upper plug portions 160u, tips 160t of nozzle plugs 160, lower surface 200L of second inject plate 200, and interior surface 200i of bore 202.

In some etch applications, inject plate 124 may be etched by high-energy ions. Therefore, the material of inject plate 124, or at least those portions in contact with plasma 41 (including nozzle tips 160t) must be compatible with the particular process. For silicon processing, a preferred material for consumable plate member 192A and second inject plate 200 is silicon. Additionally, in some etch applications (i.e., oxide etch), it is advantageous to introduce silicon into the plasma to scavenge fluorine radical. In this case, the preferred material for plate member 192A and second inject plate 200 are those materials compatible with the specific process (i.e., oxide etch). Such materials include silicon, silicon carbide, etc. Moreover, the inject plate 200 may be aluminum with hard anodized surfaces.

Figure 3C:
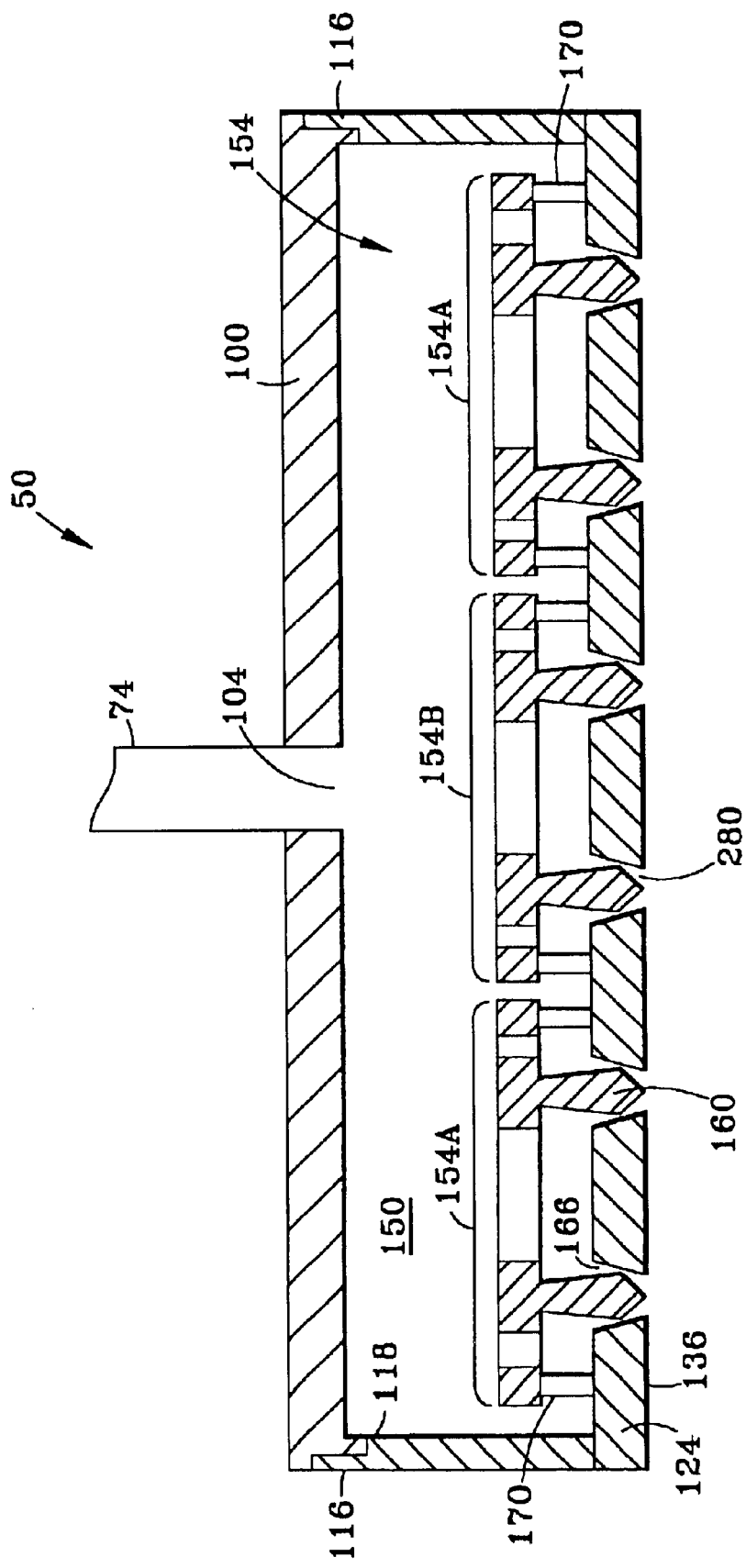
FIG. 3C is a schematic cross-sectional diagram of a gas injection manifold according to a third embodiment of the present invention, wherein the plug plate is divided into multiple sections.
Figure 3D:
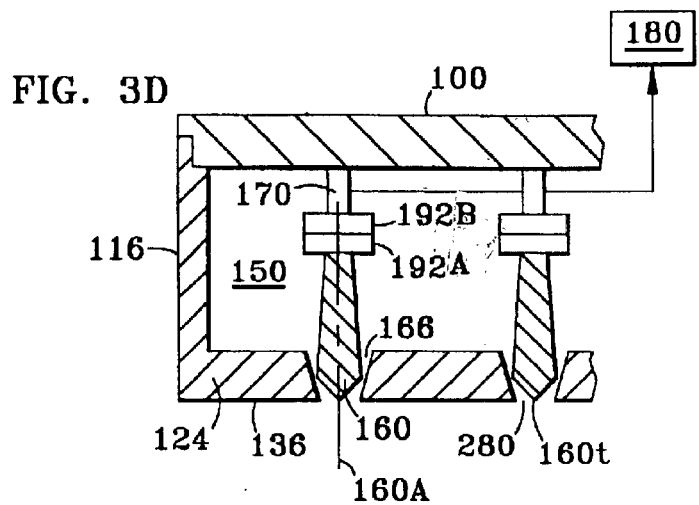
FIG. 3D is a schematic cross-sectional partial diagram of a gas injection manifold of the present invention, wherein each nozzle plug is connected to a displacement actuator, thereby allowing for control of individual nozzle units.

With reference now to FIG. 3C, a third embodiment of a gas injection manifold apparatus of the present invention similar to that of FIG. 3A is shown. In the apparatus of FIG. 3C, plug plate 154 is divided into multiple sections., e.g., two sections 154A and 154B, wherein section 154A is concentric with 154B. Plug plate section 154A and 154B may be displaced independently, thereby enabling the adjustment and control of the gas injection properties above different regions of wafer 44. Although FIG. 3C presents an embodiment similar in design to that shown in FIG. 3A, the same design revisions may be extended to the second embodiment of FIG. 3B. In fact, extensions to the second embodiment of the present invention may be preferred, since the division of plug plate 154 taken to the limit of the independent translation of each and every nozzle inner wall 166i of bore 166. Nozzle units 250 each include a gas entrance region 270 adjacent plug plate 154 at upper surface 134 of inject plate 124, and a gas exit region 280 at lower surface 136 of inject plate 124 (FIG. 3A) or at lower surface 200L of the second inject plate 200 (FIG. 3B).

The gas injection manifolds shown in FIGS. 3A and 3B may serve as the anode in an inductively coupled plasma source (ICP), as shown in FIG. 2A, or as the upper RF electrode in a capacitively coupled plasma source (CCP) as shown in FIG. 2B. In the latter case, gas may be introduced to plenum 150 through the interior of an inner conductor 281 of the upper electrode via gas supply line 74. The RF feed inner conductor 281, back plate 100, end-walls 116 and inject plate 124 can serve as an upper electrode of a CCP.

Operation of Gas Injection Manifold

Now described is the operation of the gas injection manifold of the present invention. With reference now to FIGS. 2A, 2B, 3A and 3B, in operation, one or more gases is supplied from gas supply system 70 via gas supply line 74 into plenum 150 through one or more apertures 104 (only one aperture is shown). Gas supply system 70, supply line 74 and plenum 150 are designed such that the pressure in plenum 150 can be kept relatively constant during steady state operation. Accordingly, plenum 150 holds a volume of gas having a total pressure $P_t$ at a total temperature $T_t$. Gas in plenum 150 is then introduced under pressure and in a controllable manner into chamber interior region 40 of plasma reactor chamber through a plurality of adjustable nozzle units 250, and is directed toward surface 44S of wafer 44.

The gas flow into chamber interior region 40 from nozzle units 250 is controlled by the action of displacement actuators 170 via actuator control unit 180 in electronic communication therewith. Displacement actuators 170 change the amount by which nozzle plug 160 extends into bore 166 by moving plug plate 154 relative to inject plate 124. Through the design of the nozzle plug 160 (i.e., its contour, shape, etc.) and/or the design of the nozzle bore 166 (i.e., its contour, shape, etc.), the axial translation of nozzle plug 160 within and relative to nozzle bore 166 along bore axis 160A can create either a change in the area of throat 260 while maintaining the same area at gas exit region 280, a change in the area of exit region 280 while maintaining a constant area of throat 260, or a change in both the area of throat 260 and the area of exit region 280. The adjustment of these nozzle properties via translation of nozzle plug 160 within nozzle bore 166 allows for adjusting the gas mass flow rate and/or gas expansion through nozzle unit 250 relative to adjacent nozzle units or clusters of nozzle units.

Figure 3E:
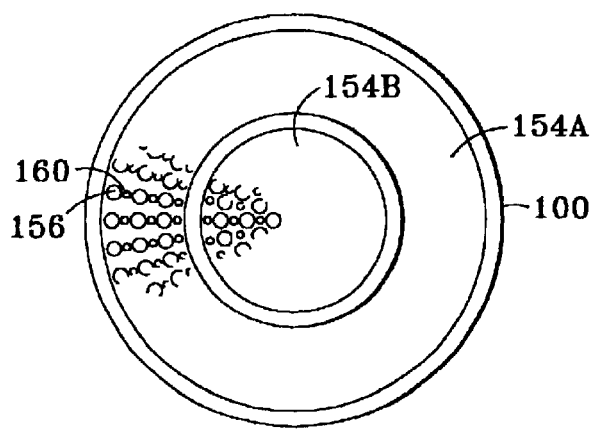
FIG. 3E is a schematic plan view of the gas injection manifold of FIG. 3C, showing the sections of the plug plate arranged concentrically.
Figure 3F:
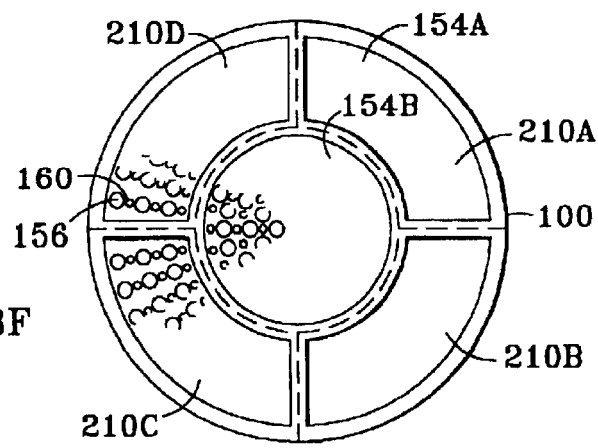
FIG. 3F is schematic plan view of the gas injection manifold of FIG. 3C, showing the sections of the plug plate arranged concentrically and also divided into four azimuthal sections.
Figure 3G:
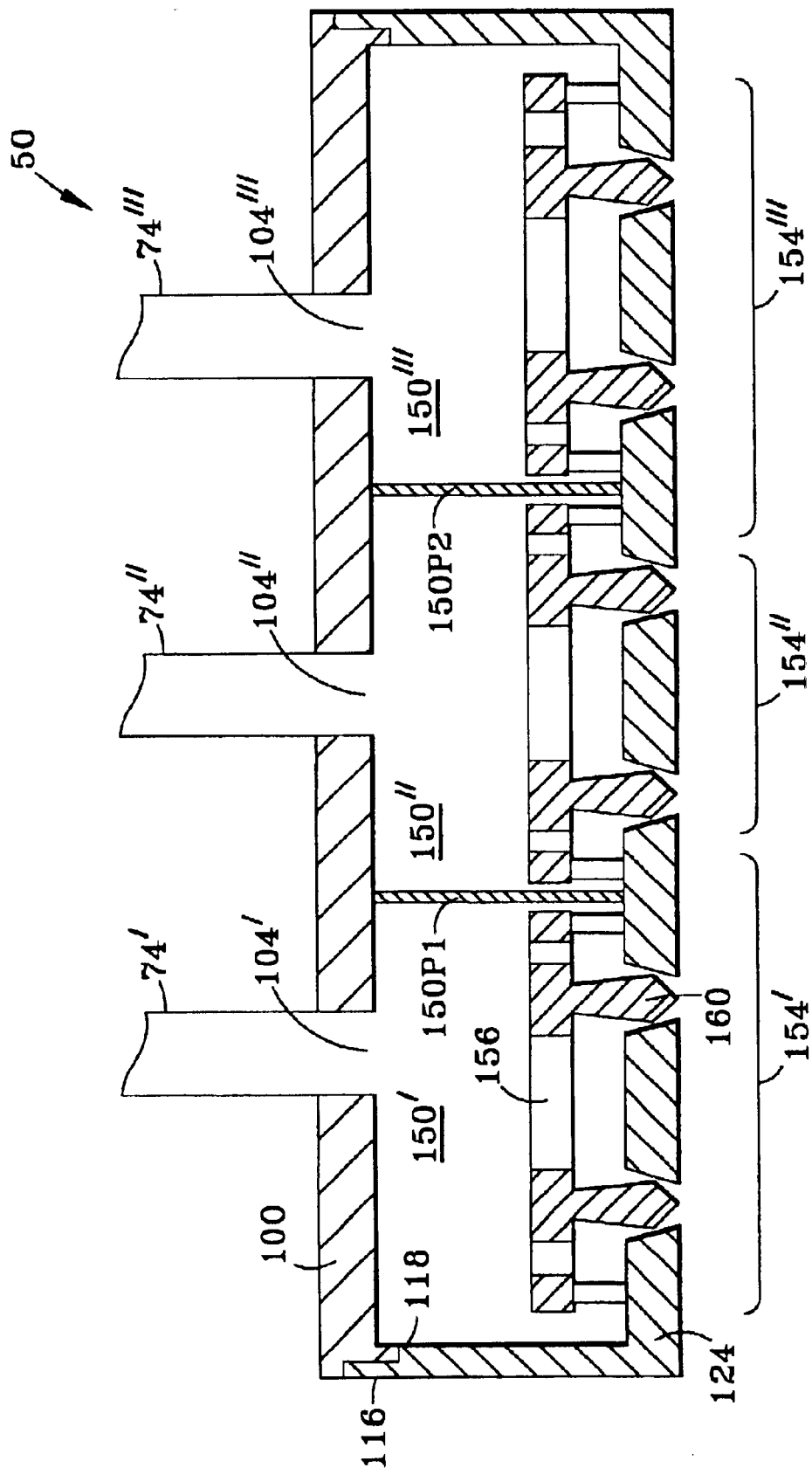
FIG. 3G is a schematic cross-sectional diagram of a gas injection manifold according the present invention, showing multiple gas gas conduits connected to multiple backplate apertures corresponding to multiple plenum sections.
Figure 3H:
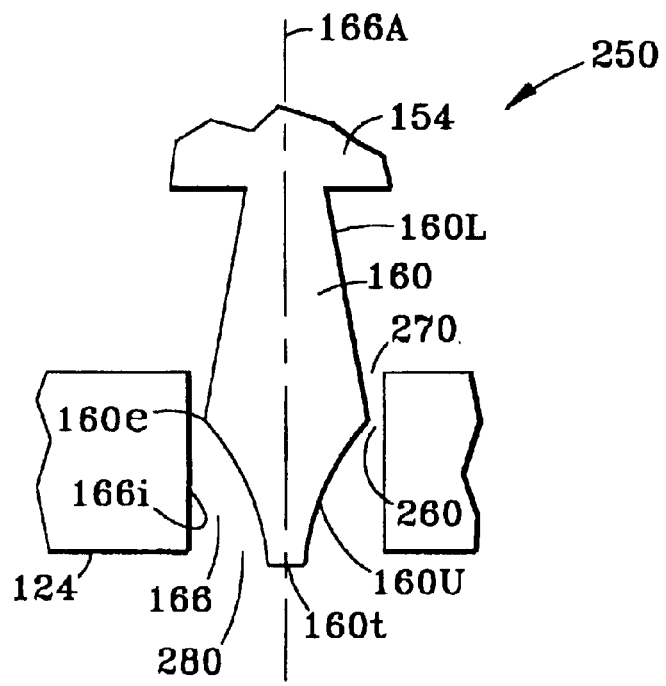
FIGS. 3H–3M are schematic cross-sectional diagrams of a nozzle unit according to first through sixth embodiments, respectively.

For example, with reference to FIG. 3H, a nozzle unit 250 is shown comprising a nozzle plug 160 inserted within a bore 166 through an inject plate 124. Changing the amount by which nozzle plug 160 extends into bore 166 does not affect the size (i.e., area) of throat 260 per se, but does change the area of gas exit region 280. More precisely, the area of gas exit region 280 decreases the farther nozzle plug 160 extends into bore 166.

By virtue of the outwardly tapered shape of nozzle plug 160 of nozzle unit 250 in FIG. 3H, its position within bore 166 defines an area ratio R between the area of gas exit region 280 and the annular area of throat 260. This ratio, in turn, defines the exit Mach number M (i.e., the ratio of the local velocity to the local speed of sound). The exit Mach number M may be greater than unity, i.e., a supersonic gas flow, only when the gas flow chokes at throat 260. The conditions for choking are described in greater detail below. However, there exists only one solution for area ratio R (and, hence, exit Mach number M) that enables a pressure-matched supersonic gas flow that is uniquely determined by both by the total pressure $P_t$ of plenum 150, and the static pressure $P_c$ in chamber interior region 40.

Figure 4A:
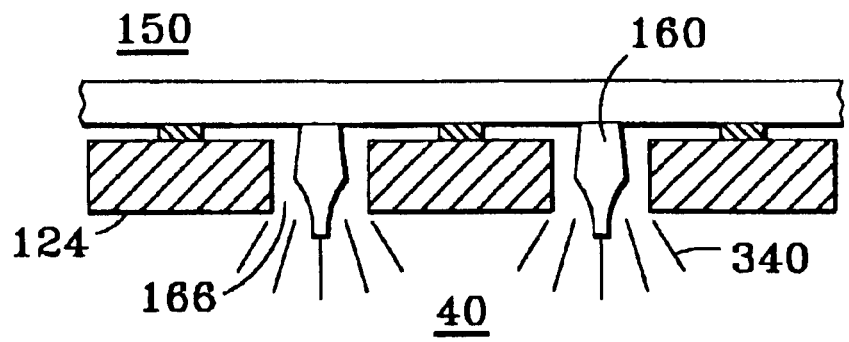
FIGS. 4A–4C are cross-sectional schematic diagrams of a section of a gas injection manifold operating in an under-expanded mode (FIG. 4A), a pressure-matched mode (FIG. 4B) and an over-expanded mode (FIG. 4C)
Figure 4B:
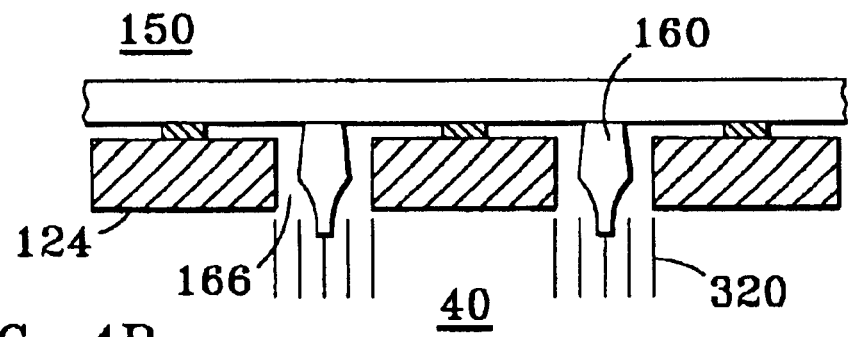
Figure 4C:
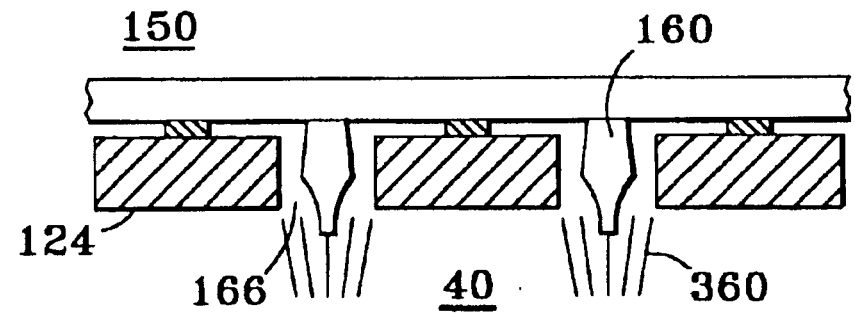

FIGS. 4A–4C illustrate three separate gas flow conditions corresponding to three different placements of nozzle plug 160 within bore 166. With reference to FIG. 4B, the placement of nozzle plug 160 is such that the corresponding area ratio R enables the expansion of the gas flowing through nozzle unit 250 from plenum 150 to chamber interior region 40. This is referred to as the "pressure-matched" condition. In the pressure-matched condition, gas issues from gas exit region 280 with a bulk supersonic speed (M>1) as a gas jet 320 in a direction nominally parallel with bore central axis 166A of bore 166. Gas jet 320 can be referred to as being "collimated" when exiting gas exit region 280.

With reference now to FIG. 4A, if nozzle plug 160 is extended farther into bore 166 from the position associated with the pressure-matched condition, the area ratio R is reduced and the gas flow though nozzle unit 250 becomes "under-expanded". When the gas is under-expanded at gas exit region 280, there exists a gradient in pressure between the exit pressure Pe and chamber interior region pressure Pc such that the respective ratio $P_e/P_c>1$. During this condition, a gas jet 340 expands into plasma chamber interior region 40 and hence, diverges relative to bore central axis 166A.

With reference now to FIG. 4C, if nozzle plug 160 is partially extracted from bore 166 relative to the position associated with the pressure-matched condition described above, the area ratio R is enlarged and the gas flow becomes "over-expanded." When the gas is over-expanded at gas exit region 280, there exists a gradient in pressure between the exit pressure $P_e$ and the chamber pressure $P_c$ such that the respective ratio $P_e/P_c<1$. During this condition, a gas jet 360 forms. The latter undergoes a shock wave to equilibrate the pressures. In general, gas jet 360 nominally converges when exiting gas exit region 280 relative to bore central axis 166A.

In either of the flow conditions for gas jets 320, 340 and 360, described above with respect to FIGS. 4A–4C, gas is directed toward wafer 44 in a supersonic manner. This type of gas flow has the benefit of maximizing the statistical probability of a gas atom or molecule moving in a direction substantially normal to wafer surface 44S and interacting with the wafer during wafer processing using system 10 of the present invention.

With continuing reference to FIGS. 4A–4C, when the ratio of the total pressure $P_t$ in plenum 150 (e.g., at gas entrance region 270) to the chamber pressure $P_c$ beyond gas exit region 280 is sufficiently large, nozzle unit 250 reaches a "choked" condition in which the volume flow rate is invariant with either a further reduction of the backpressure or an increase in $P_t$. For a fixed size throat 260, the mass flow through nozzle unit 250 can only be increased by increasing the gas entrance region total pressure, thereby affecting the gas density, or by adjusting the throat area.

Figure 3I:
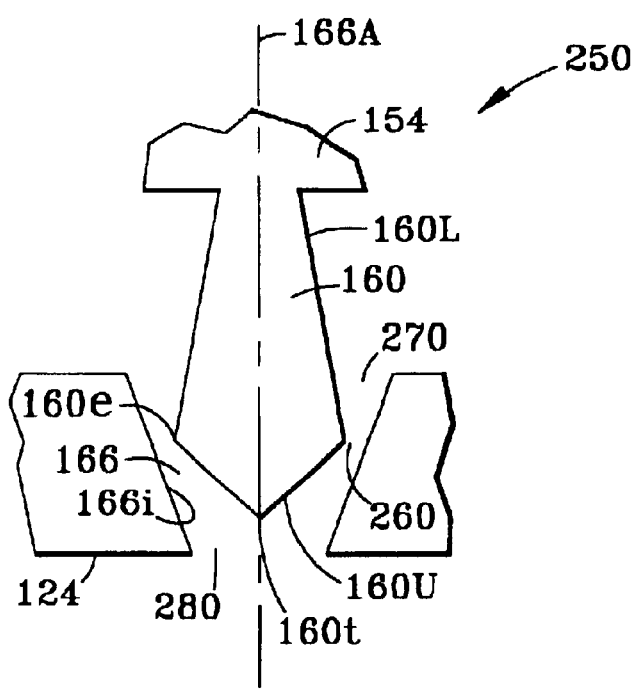

Alternatively, with reference to FIGS. 3G and 3I, nozzle unit 250 is shown comprising a nozzle plug 160 inserted within a tapered bore 166. In FIG. 3H, nozzle plug lower portion 160l is linearly outwardly tapered up to edge 160e, and upper portion 160u is non-linearly inwardly tapered from edge 160e to tip 160t. In FIG. 3I, lower portion 160l is linearly outwardly tapered up to edge 160e, and upper portion 160u is cone-shaped, with a point at tip 160t. The displacement of plug 160 into bore 166 (i.e., "downward" displacement) for nozzle unit 250 of FIG. 3I creates a reduction in the area of throat 260, whereas the displacement of plug 160 from bore 166 (i.e., "upward" displacement) creates an enlargement of area of throat 260. This is not true, however, for nozzle unit 250 depicted in FIG. 3H. However, unlike nozzle unit 250 in FIG. 3H, the exit area 280 remains the same if nozzle plug tip 160t remains within nozzle bore 166 i.e., nozzle plug tip 160t remains above the plane defined by lower surface 136 of inject plate 124. If all nozzle plugs 160 in an array of nozzle plugs are translated simultaneously within a respective array of bores 166 (as shown in FIGS. 3A and 3B), and all nozzle units are in pneumatic communication with a single gas plenum 150 (which is fed from a single gas supply 70 and mass flow controller (not shown)) through aperture 104), then a change in the area of throat 260 will affect a change in gas plenum 150 total pressure $P_t$. This change in the total pressure will compensate for the change in the area of throat 260. Accordingly, the gas mass flow rate through each nozzle unit 250 remains unchanged. Hence, through a change in the area of throat 260, the pressure ratio can be adjusted across inject plate 124 (as well as the ratio of the exit area to the throat area) to affect the gas expansion into vacuum interior region 40 and to achieve the desired exit Mach number.

Figure 3J:
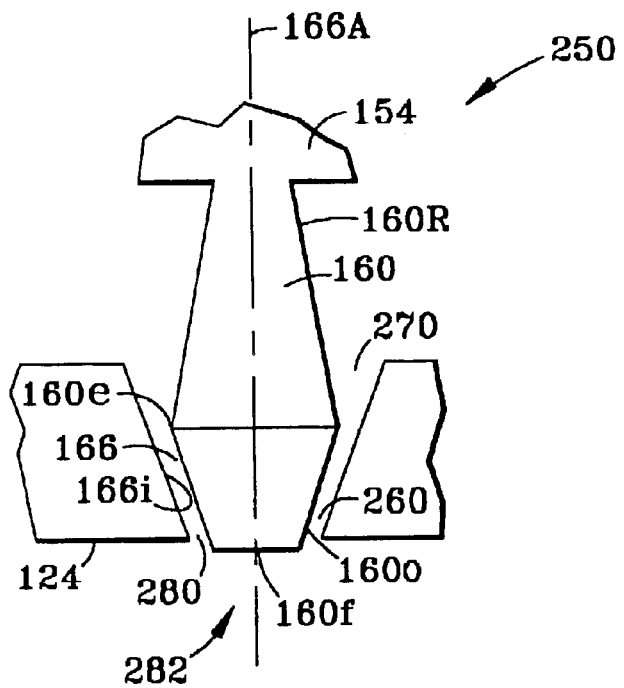

Alternatively, with reference now to FIG. 3J, an alternate embodiment of nozzle unit 250 is shown, comprising a nozzle plug 160 inserted within a tapered bore 166 through an inject plate 124. Nozzle plug 160 shown in FIG. 3J is similar to the design shown in FIG. 3I, except that the conical upper portion 160u in FIG. 3J is truncated at tip 160t and has an outer surface 160o, wherein the degree of taper of the conical surface is substantially the same as the taper of surface 166i of bore 166. The displacement of plug 160 within bore 166 creates a reduction or increase in the area of throat 260. However, in either case, the area ratio, i.e., ratio of the area of exit region 280 to the area of throat 260 remains constant, i.e., unity. This plug design simply moves throat 260 to the same location as nozzle unit exit 280. Therefore, the gas freely expands into low-pressure vacuum interior region 40 in the expansion region 282.

For a given pressure ratio, i.e., ratio of the total pressure $P_t$ for the gas plenum 150 to the chamber pressure $P_c$ in interior region 40, there exists a design for the taper angle of bore 166 and the taper angle of nozzle plug 160 outer surface 160o such that gas emanates from nozzle unit 250 as a collimated free jet, similar to that shown in FIG. 4B. Deviations of chamber pressure $P_c$ or the total pressure $P_t$ (due to changes in the mass flow rate) such that the pressure ratio varies from the design case leads to a flow condition similar to the under-expanded case described in connection with FIG. 4A, or the over-expanded case described in connection with FIG. 4C.

For an inviscid, isentropic, continuum fluid, there exists a relationship between the taper angle, or area ratio, and the pressure ratio. This relationship can be ascertained from a standard text book on compressible fluid dynamics. For variations from the assumptions made above, this relationship may be determined from more complex theoretical modeling and experimental verification of this relationship. It may be empirically established for the sake of nozzle design and control.

For example, an increase in the pressure ratio from the design case will lead to a flow condition similar to the under-expanded case and a decrease in the pressure ratio from the design case will lead to a flow condition similar to the over-expanded case. As above, if all nozzle plugs 160 in an array of nozzle plugs are translated simultaneously within a respective array of bores 166 (as shown in FIGS. 3A and 3B) and all nozzle plugs are in pneumatic communication with a single gas plenum 150 fed from a single gas supply 70 and mass flow controller (not shown) through aperture 104, then a change in the area of throat 260 changes gas plenum 150 total pressure $P_t$ when the gas flow is choked. This change in the total pressure will compensate for the change in the area of throat 260. Therefore, the gas mass flow rate through each nozzle unit 250 will remain unchanged. Hence, through changing the area of throat 260, one can adjust the pressure ratio across the inject plate in order to affect the gas expansion into the interior region 40 and the attainable Mach number.

Figure 3K:
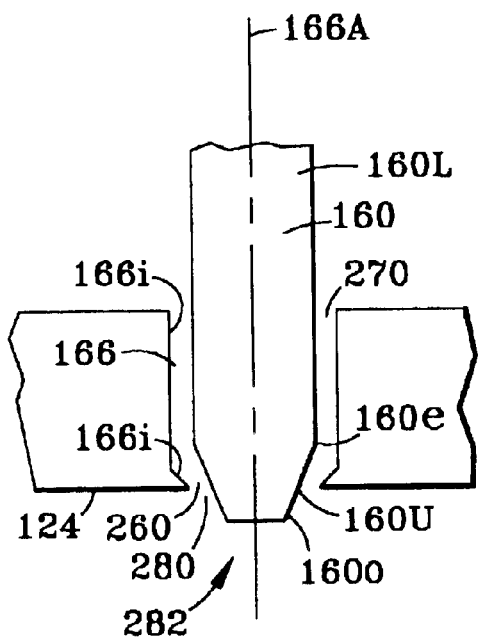

With reference now to FIG. 3K, an alternative to nozzle unit 250 of FIG. 3J is shown. In FIG. 3K, nozzle plug 160 is similar in design to the nozzle plug 160 in FIG. 3J, except that lower portion 160l is a straight-walled cylinder. Moreover, nozzle bore 166 is also a straight-walled cylindrical bore with a shortened tapered section (or knife edge)

at gas exit region 280. As before, nozzle throat 260 is coincident with gas exit region 280. The primary advantage in the design of the present embodiment of nozzle unit 250 is that the narrow annular region of nozzle unit 250 can be reduced to a single plane at gas exit region 280 (i.e., the annular region leading up to nozzle throat 260 can be shortened). In general, the same design rules as described for nozzle unit 250 of FIG. 3J can be extended to the nozzle unit of FIG. 3K. Although nozzle unit 250 of FIG. 3K is somewhat more complex relative to that of FIG. 3J, it offers an advantage for low pressure applications in that the nozzle length for boundary layer development can be shortened. This can be important for low-pressure applications, especially when the internal flow within nozzle unit 250 exhibits transition flow behavior.

Figure 3L:
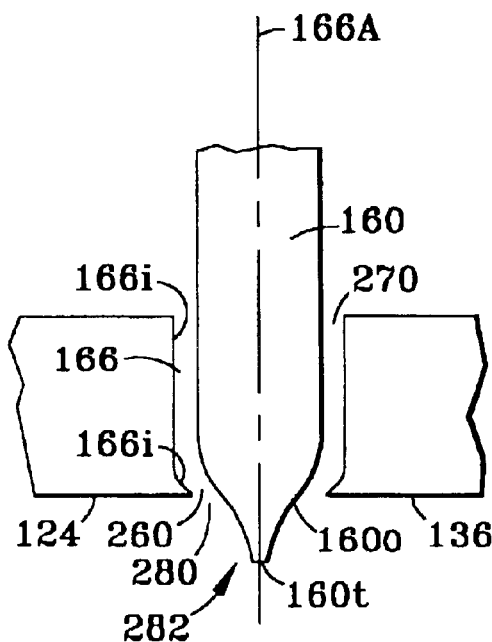

With reference now to FIG. 3L, an alternative to the nozzle unit design shown in FIG. 3K is shown. In FIG. 3L, nozzle plug 160 is similar in design to nozzle plug 160 in FIG. 3K, except that inner surface 166i of nozzle bore 166 in FIG. 3K as well as outer surface 160o of nozzle plug 160 are smoothly varying (i.e., the wall slope is continuous). Surfaces 166i and 160o may be designed using the Method of Characteristics for the expansion of a gas through a nozzle from a region of high pressure to a region of low pressure (when the pressure ratio exceeds the critical pressure ratio described before and there exists a predominantly inviscid flow through the nozzle). Although the design of nozzle unit 250 in FIG. 3L is somewhat more complex than that for the nozzle unit of FIG. 3K, the flow does not experience abrupt changes as it expands through the nozzle unit 250.

Figure 3M:
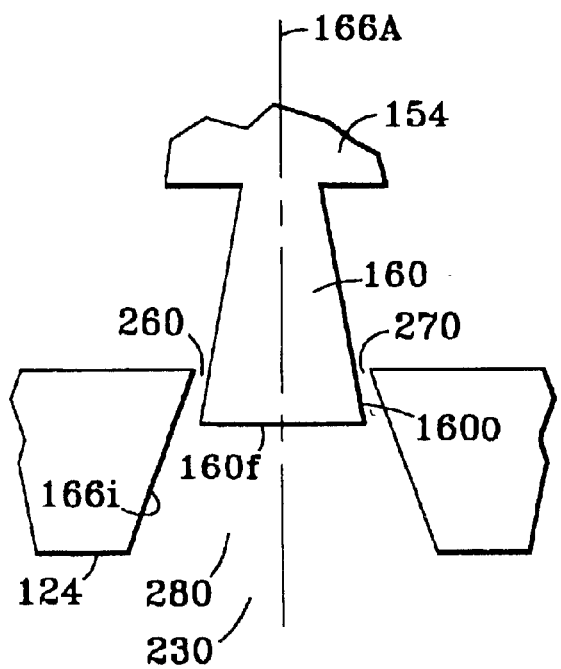

With reference now to FIG. 3M, in a final alternative embodiment, nozzle unit 250 of FIG. 3M includes bore 166 where inner surface 166i is outwardly tapered relative to axis 166A (i.e., the area of gas exit region 280 is larger than the area of entrance 270). Nozzle plug 160 is purely a conical section with an outwardly tapered outer surface 160o, whose taper angle is less than that of inner surface 166i of nozzle bore 166. Nozzle plug tip 160t has a flat portion that becomes a flat nozzle end 160f whose diameter is sufficiently small to provide clearance when inserted into bore 160 at nozzle entrance 270. In the present embodiment of nozzle unit 250, throat 260 is coincident with nozzle entrance 270. When nozzle plug 160 is extracted from bore 166, the area of nozzle throat 260 decreases, whereas when nozzle plug 160 is inserted into bore 166, the area of nozzle throat 260 increases. As before, under similar conditions, the increase or decrease in the area of nozzle throat 260 has a correspondingly similar effect on gas plenum 150 total pressure. Furthermore, regardless of the translation of nozzle plug 160, the area of exit region 280 remains unchanged. An advantage of the design of the present embodiment relative to that of FIG. 3I is that the area ratio can, in general, be made to be much larger (i.e., applicable to higher pressure ratios). However, when nozzle units 250 are employed during plasma processing applications, the (typically) larger nozzle exit area 280 of FIG. 3M can allow plasma to enter bore 166, with the result that high energy etching or sputtering within the nozzle can lead to the erosion of the nozzle unit inner surfaces.

In all cases, regardless of the internal flow conditions within nozzle units 250 described above in connection with FIGS. 3H–3M, the expansion of gas from plenum 150 to interior region 40 can be affected by the translation of nozzle plug 160 within the nozzle bore 166. This allows for the tuning of the gas injection condition for optimal substrate processing in interior region 40.

Figure 5:
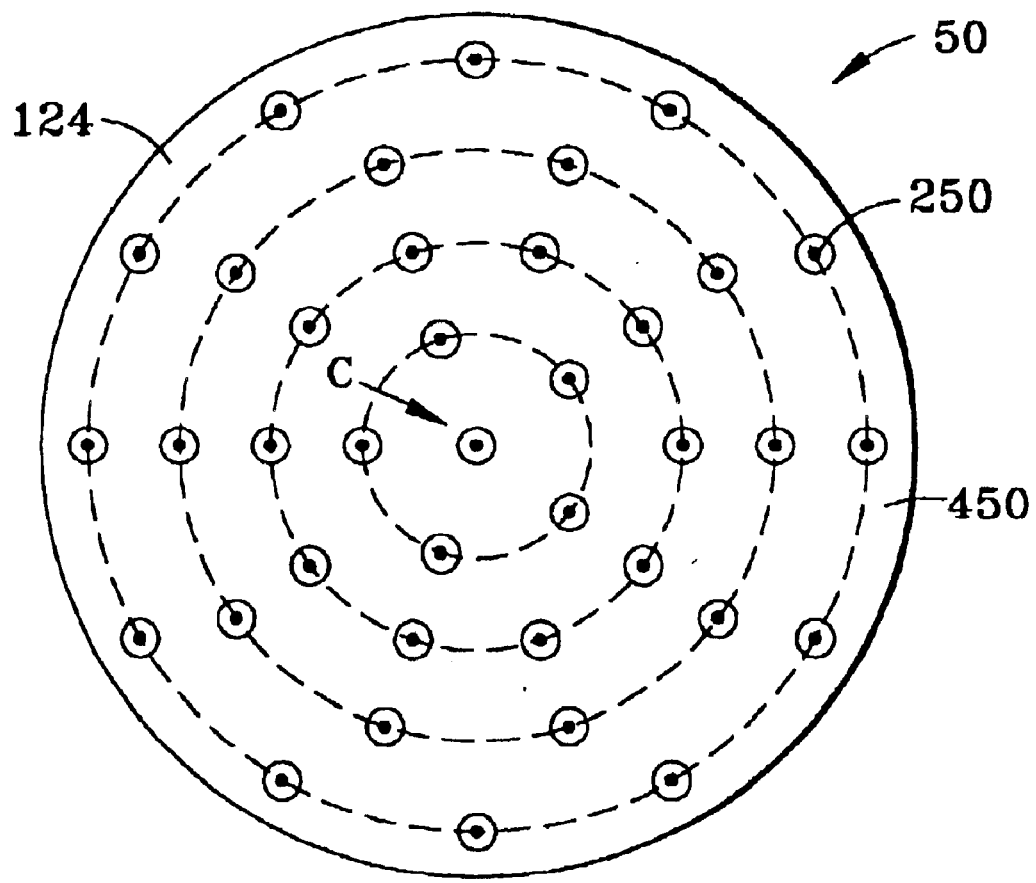
FIG. 5 is a plan view of a gas injection manifold having a radial arrangement of nozzle units.

With reference now to FIG. 5, when employing an unsegmented plug plate 154 as shown in FIGS. 3A and 3B, a preferred geometry for the arrangement of nozzle units 250 is in a series of concentric rings 450 entered about a center C defined by normal line N from substrate 44 (see FIG. 2A).

It will be understood that other geometries for arranging nozzle units 250, such as Cartesian or hexagonal geometries, are also possible. In fact, the distribution of nozzle units 250 across inject plate 124 may be varied to adjust the spatial distribution of the inlet gas mass flow rate above wafer 44. Moreover, the spatial distribution of the area (i.e., size) of gas throat region 260 and/or the number density of nozzle units 250 across the inject plate 124 may be varied to affect the spatial distribution of the gas specie(s) concentration above wafer 44. Nozzle units may be clustered to optimize the coalescence of gas jets, or to increase or decrease the flux of fresh gas in chosen areas over wafer 44. For example, to increase the mass flow rate of gas into plasma reactor chamber interior region 40 at edge 44E of substrate 44, nozzle units 250 in inject plate 124 above substrate edge 44E may be provided with a larger cross-sectional gas throat region 260 area. Alternatively, the number density of nozzle units 250 directing gas flow to substrate edge 44E can be increased.

Adjusting the Spatial Distribution of Gas Properties

As discussed above, the expansion of gas through a nozzle unit 250 or cluster of nozzle units into chamber interior region 40 can be varied over different regions of wafer 44 simply by adjusting the translation of plug plate 154 of one region relative to another (e.g., region 154A relative to 154B in FIG. 3E). Moreover, the design described in FIG. 3G creates additional control flexibility. In particular, it enables a variation of the gas specie(s) and/or gas mass flow rate delivered to each independent gas plenum 150', 150", etc. This added flexibility enables the adjustment of the gas mass flow rate and/or gas specie(s) introduced to different regions of plasma 41 over wafer 44. Additionally, simply the change of the gas specie(s) (i.e., due to changes in the ratio of specific heat for the gas or gas mixture) or the change of mass flow rate regulated by a mass flow controller feeding the gas plenum (i.e., due to changes in the gas plenum total pressure and, hence, the pressure ratio) can affect the gas expansion through nozzle unit(s) 250. This, in turn, affects the velocity distribution (and trajectory distribution) of the gas flow above different regions of wafer 44.

Adjusting the spatial distribution of the mass flux to different regions over wafer 44 can be accomplished using the segmented, un-partitioned nozzle unit 250 array of FIG. 3C with any of the nozzle unit designs described in connection with FIGS. 3I–3M that affect changes in the area of nozzle throat 260 when nozzle plug 160 is translated within nozzle bore 166 (i.e., FIGS. 3I through 3M). When one nozzle plug 160 or a group of nozzle plugs are translated relative to all other nozzle plugs or other groups of nozzle plugs, the change in gas plenum 150 total pressure $P_t$ is small. This is because the change in the total nozzle unit throat area (i.e., the sum of the throat area for all nozzle units in gas injection system 50) is relatively small. The change in the throat area of a single nozzle unit or group of nozzle units can, however, be large relative to the throat area of that given nozzle unit or group of nozzle units. Therefore, due to the local change in the nozzle unit volume flow rate (due to changes in the nozzle throat area), the local mass flow rate into a particular section of interior region 40 is changed relative to other sections of the same regions. Of course, to conserve mass, if the mass flow rate through one region of nozzle unit(s) is decreased, then the mass flow is slightly increased through the remaining nozzle units (and vice versa). Note that although the physical mechanisms may be different, this may be applicable for any conditions within the nozzle (i.e., continuum/free molecular flow or choked/unchoked).

Monitoring Process Conditions

With reference again to FIGS. 2A, 2B, 3A, 3B, 3C and 3F, to achieve a repeatable pre-specified gas jet condition for a particular semiconductor process, in-situ monitoring of the total pressure Pt of plenum 150 (or sub-plenums (sections) 150', 150", etc.) of gas manifold 50 and chamber pressure $P_c$ of chamber interior region 40 is employed through the use of pressure sensors P1 and P2 arranged in plenum 150 and interior region 40, respectively (see, e.g., FIG. 2A). Pressure sensors P1 and P2 are electrically connected to control unit 80. The location of nozzle plug 160 within bore 166 can be adjusted, as described above, to set the area ratio R or the pressure ratio of nozzle unit 250 to produce the desired gas flow condition (i.e., gas jet 320, 340 or 360 per FIGS. 4A–4C). Control unit 80 monitors the pressure in interior regions 150 and 40 with pressure sensors P1 and P2, respectively. Based on the pressures sensed with pressure sensors P1 and P2, control unit 80 sends electronic signals to actuator control unit 180 to activate displacement actuators 170, which adjusts the positions of nozzle plugs 160 within nozzle units 250.

When a pressure matched condition at nozzle exit region 280 is desired, control unit 80 uses measurements of $P_t$ and $P_c$ from pressure sensors P1 and P2 to determine the proper area ratio from continuum theory (as described above), and then adjusts nozzle plug 160 accordingly to create the desired area ratio or pressure ratio for nozzle units 250. As stated above, for an inviscid, isentropic, continuum fluid, the relationship between the area ratio and the pressure ratio can be ascertained from a standard text book on compressible fluid dynamics, and may be determined from more complex theoretical modeling and experimental verification of this relationship or may be empirically established for the sake of nozzle design and control.

The electronic signals from control unit 80 to actuator control unit 180 are calibrated such that the appropriate controlling voltage is applied to displacement actuators 170. Since the expansion of the gas in nozzle units 250 may be such that it passes through the transition flow regime, the applicability of continuum theory can be verified using separate velocity measurements of the gas jets. A time-of-flight mass spectrometer (TOF), for example, may be employed to sense the neutral gas velocity distribution and directivity downstream of gas exit region 280. In a preferred embodiment of the present invention, such measurements are made and used to build a database of measurements stored in control unit 80 that can be used to deal with deviations from the continuum theory to determine the proper ratio R and ultimately generate the proper electronic control signal to transducer control unit 180 to properly adjust nozzle units 250.

Moreover, control unit 80 can also monitor the area of throat 260 for each nozzle unit or cluster of nozzle units (as in FIG. 3C) by correlating the throat area with the axial position of nozzle plug 160 within the nozzle bore 166. This determination, in consonance with the measurement of gas plenum 150 total pressure $P_t$, can be used to determine the mass flow rate through a single nozzle unit or group of nozzle units.

One of the advantages of the preferred embodiment associated with adjustable nozzle units 250 is the flexibility it offers in terms of adjustability of gas flow for a particular semiconductor process over a wide range of possible operating conditions. However, for other applications, for example, when a low cost solution is desired and it is known that a narrow range of operating conditions is likely, several alternative embodiments of nozzle units 250 for gas manifold 50 can be used.

Double Conical Nozzle Array

With reference now to FIGS. 6 and 7, an alternative embodiment of the gas injection manifold 50 of the present invention is a gas injection manifold 500 having a nozzle array plate 501 which includes a nozzle array 502 comprising a plurality of convergent-divergent double-conical-shaped nozzles 504. Nozzles 504 each have an inner wall 508, a gas entrance region 510, a gas exit region 516, and a throat 520 at or near the nozzle mid-point. The portion of nozzle array 502 below throat 520 is the divergent portion, and the portion of the nozzle above the throat is the convergent portion. The gas flow dynamics are similar to those described above with respect to gas manifold 50. However, since gas manifold 500 has no moving parts, it works under a narrower range of operating conditions. As described above, due to the nature of the fixed geometry, variations of the mass flow rate (or plenum 150 total pressure Pt) and/or the chamber pressure Pc will affect the exit conditions of the nozzle, i.e., exit Mach number, gas velocity directivity, etc. One way to circumvent this issue is to design an injection plate comprising a plurality of convergent-divergent nozzles, wherein the total distribution of nozzles is the superposition of overlying distributions of different sized nozzles, or varying area ratio. Stated in other terms, if nozzle array 502 were composed of several groups of nozzles 504, the nozzles of each group being designed to be optimum for a different set of operating conditions, then, to the extent possible, the nozzles of each group would preferably be distributed uniformly over the Surface of nozzle array plate 501.

For example, a group of nozzles designed ("sized") for a first flow condition (e.g., having a first gas entrance region 510 area, a first gas exit region 516 area and a first throat 520 area) can be mixed with a group of nozzles designed ("sized") for second flow condition (e.g., having a second entrance region 510 area, a second gas exit region 516 area and a second throat 520 area). Therefore, for a given process and the associated conditions, some nozzles 504 will operate at their optimal design, while others operate at less than their optimal design. In this manner, the range over which the array of nozzles 504 is optimal is expanded.

In the divergent portion of conical nozzle 504, the gas expands outward along inner wall 508. Thus, there is some fraction of the gas flow that is perpendicular to the normal (and desired) flow; i.e., a non-zero transverse velocity gas flow component at gas exit region 516. The maximum wall angle θ preferably does not exceed approximately 18 degrees for a conical design. If angle θ is greater than 18 degrees, the flow can separate, and the boundary layer on wall 508 can become detached. Although it is simple to design and fabricate a lossless divergent nozzle, the maximum wall angle equates to a nozzle length for a given area ratio. Therefore, to achieve a large area ratio, the nozzle must be long and can be impractical. Accordingly, preferred dimensions for gas exit region 516 and throat 520 range from about from 0.001 to 0.2 inches in diameter and from 0.001 to 0.040 inches in diameter, respectively. The preferred dimension for the gas entrance region 510 is that it be equal to or (preferably) greater than the dimension specified for throat 520.

Figure 1:
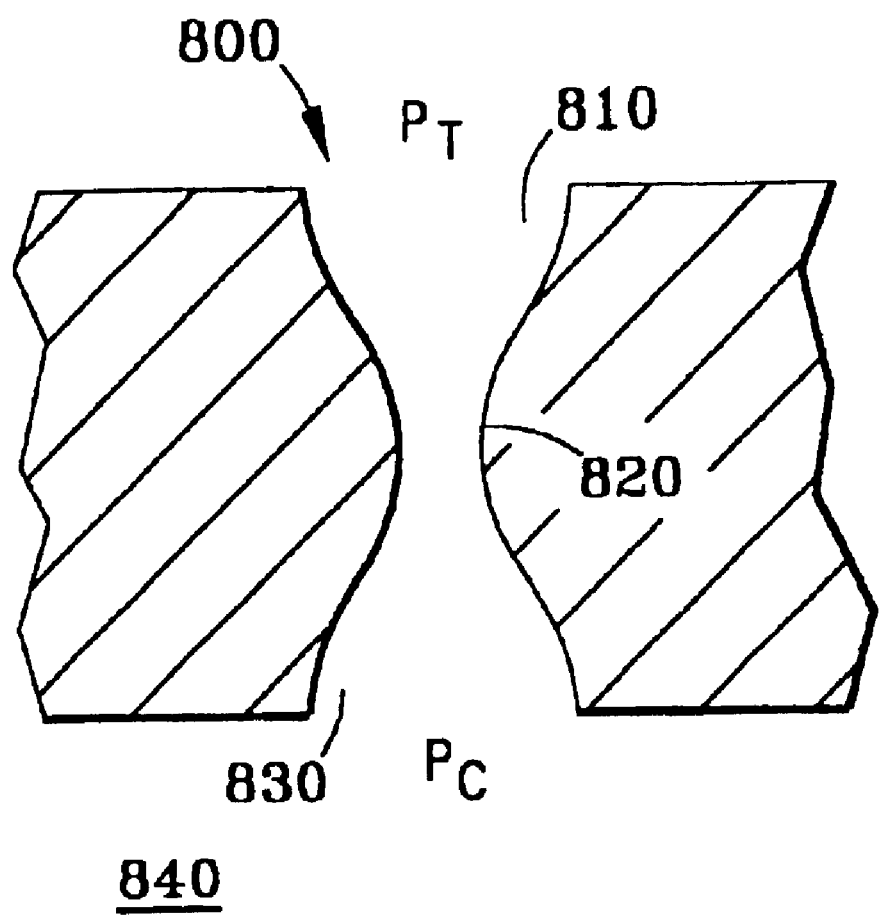
FIG. 1 is a cross-sectional diagram of a Laval nozzle for the purpose of explaining the flow dynamics associated with the expansion of a gas from a region of high pressure to a region of low pressure.

Lastly, a sixth embodiment would be to allow for the design of nozzles that are not restricted to conical sections but rather have smoothly varying walls (continuous wall slope) as in the Laval nozzle shown in FIG. 1. The smoothly varying walls can improve the internal flow dynamics in that the respective expansion and compression waves (if any) are infinitesimally weak, rather than strong waves that may emanate from points or regions of discontinuous wall slope. However, nozzles with smoothly varying walls can be more complex to fabricate.

Concave Nozzle Array

Figure 8:
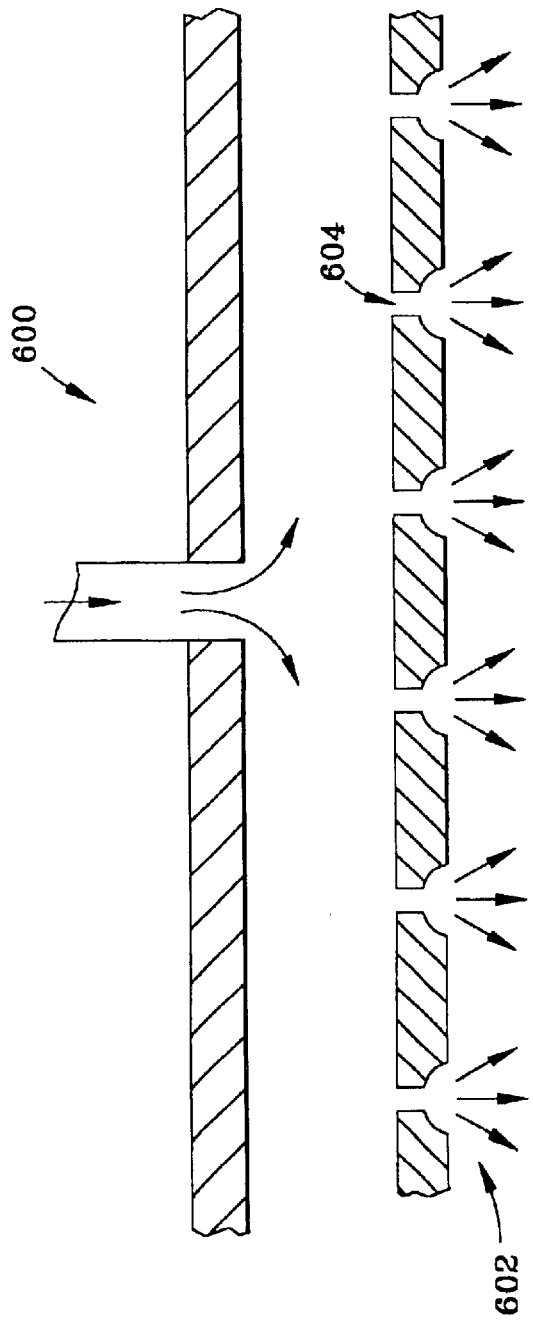
FIG. 8 is a cross-sectional schematic diagram of a gas injection manifold according to the present invention similar to that of FIG. 6, but where the nozzles have a cylindrical upper section at the gas entrance end and a concave lower section at the gas exit end.
Figure 9:
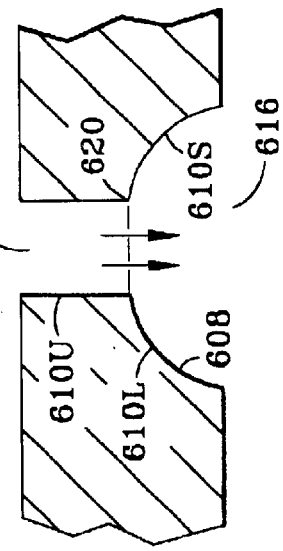
FIG. 9 is a cross-sectional close-up schematic diagram of a nozzle of the gas injection manifold of FIG. 8.

With reference now to FIGS. 8 and 9, an alternative embodiment of the gas injection manifold of the present invention is gas injection manifold 600 having a nozzle array 602 comprising a plurality of concave nozzles 604 each having an inner wall 608 that defines a cavity having an upper cylindrical section 610U and a lower concave region 610L having a surface 610S. Each nozzle 604 has a gas entrance region 612, a gas exit region 616, and a throat 620. Region 610L of nozzle 604 below throat 620 is the divergent portion. As with gas injection manifold 500, gas injection manifold 600 has no moving parts and so works under a narrower range of operating conditions than gas injection manifold 50.

The contour of inner wall 608 of nozzle 604 is designed to minimize total pressure losses from oblique shocks when turning the flow inward, i.e., using the Method of Characteristics to design a "minimum length" or "perfect" nozzle. The "perfect" nozzle 604 comprises smoothly varying surface 610S with convex and concave sections (i.e., the Laval nozzle as shown in FIG. 1) in the divergent portion of the nozzle. To reduce the nozzle length, the convex surface can be shrunk to a point, known as the "minimum length" nozzle. Similarly, once the nozzle is designed, it is designed for a single relationship between the total pressure $P_t$ and chamber pressure $P_c$. Therefore, any variation in either $P_t$ or $P_c$ will result in a non-pressure-matched condition at gas exit region 616.

However, as discussed above, an injection plate comprising a plurality of divergent nozzles of the present invention can be designed, wherein the total distribution of nozzles is the superposition of overlying distributions of different sized nozzles (or varying area ratio). For example, a group of nozzles designed for a first flow condition (e.g., having a first gas entrance region 612 area, a first gas exit region 616 area and a first throat 620 area) can be mixed with a group of nozzles designed for a separate flow condition (e.g., having a second entrance region 612 area, a second gas exit region 616 area and a second throat 620 area). Therefore, for a given process condition, some nozzles 604 will operate at their optimal design, while others operate at less than their optimal design. This way, the optimal range of conditions for the array of nozzles 602 is expanded.

Nozzle Unit Fabrication

The nozzle injection system of the present invention can be fabricated using any of several methods. When the nozzles are to be fabricated from materials not amenable to VLSI techniques (such as etch, deposition, etc. processes applied to semiconductor device fabrication), the nozzle plugs and nozzle bore can be fabricated using conventional methods such as machining, grinding or EDM, or any combination thereof.

As discussed above, it is preferable, and in many cases required, to present internal surfaces of the vacuum enclosure to the contained plasma that are "compatible" with the specific process. The term "compatible" is used herein to describe materials that are not substantially detrimental (i.e., to the point of failure) to the specific process. Therefore, there exist applications where the fabrication of the second inject plate 200, nozzle plugs 160 and plug plate 192B made of a material such as silicon is advantageous.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A gas injection manifold apparatus for adjustably controlling the flow of gas into a vacuum chamber, comprising a plurality of adjustable nozzle units arranged in the chamber, wherein each nozzle unit has a through bore and comprises a translatable nozzle plug movably arranged within the through bore so as to alter the flow of gas through the bore and into the chamber when said nozzle plug is translated within said through bore.

2. An apparatus according to claim 1 further comprising:

a) a backplate with at least one through aperture formed therein, having an upper surface, a lower surface, and first and second ends;

b) a plug plate having an upper surface and a lower surface and arranged adjacent and substantially parallel with said backplate, said plug plate further carrying said nozzle plugs, and extending from said plug plate lower surface; and c) an inject plate having upper and lower surfaces and first and second ends, arranged adjacent said plug plate lower surface, said inject plate having said through bores formed therein each with a bore central axis, wherein said inject plate is connected to said backplate via connecting members, and said inject plate is arranged so that said nozzle plugs movably extend within respective said through bores along said bore central axes, thereby forming in each of said nozzle units a gas entrance region, a throat, and a gas exit region;

d) wherein said backplate lower surface, said inject plate upper surface and said connecting members define a pressurizable plenum, and said nozzle plugs are movable so as to alter at least one of the location of said throat, the area of said throat, the area of said exit region and the pressure ratio between said pressurizable plenum and the vacuum chamber beyond said exit region within said through bores so as to adjust the flow of gas through said nozzle units from said pressurizable plenum to the vacuum chamber.

3. An apparatus according to claim 1, wherein the number of said nozzle plugs is the same as the number of said through bores.

4. An apparatus according to claim 2, wherein said connecting members are connected to respective first and second ends of said backplate and said inject plate.

5. An apparatus according to claim 2, further comprising displacement actuators coupled to said backplate by said displacement actuators for displacing said plug plate relative to said backplate.

6. An apparatus according to claim 5, wherein said displacement actuators are electromechanical devices.

7. An apparatus according to claim 5, wherein said displacement actuators are piezo-electric transducers.

8. An apparatus according to claim 5, further including a displacement actuator control unit in electronic communication with said displacement actuators.

9. An apparatus according to claim 2, wherein said plenum is divided into multiple sections.

10. An apparatus according to claim 9, wherein said back plate includes multiple through apertures open to respective said multiple plenum sections.

11. An apparatus according to claim 2, wherein said inject plate is fabricated from a material such as anodized aluminum.

12. An apparatus according to claim 2, wherein said inject plate is fabricated from a dielectric material such as alumina or quartz.

13. An apparatus according to claim 2, wherein said nozzle plugs are fabricated from a material such as anodized aluminum.

14. An apparatus according to claim 2, wherein said nozzle plugs are fabricated from a dielectric material such as alumina or quartz.

15. An apparatus according to claim 2, wherein said plug plate lower surface comprises a consumable material.

16. An apparatus according to claim 15, wherein said consumable material is at least one from the group of materials comprising silicon, silicon carbide and quartz.

17. An apparatus according to claim 2, wherein said plug plate comprises first and second plate members, wherein said second plate member is adjacent said inject plate and comprises a consumable material.

18. An apparatus according to claim 17, wherein at least a portion of each of said nozzle plugs comprises a consumable material.

19. An apparatus according to claim 17, wherein said consumable material is at least one from the group of materials consisting of silicon, silicon carbide and quartz.

20. An apparatus according to claim 2, wherein said lower surface of said inject plate comprises a consumable material.

21. An apparatus according to claim 20, wherein said consumable material is at least one from the group of materials consisting of silicon, silicon carbide and quartz.

22. An apparatus according to claim 2, wherein said inject plate comprises first and second plate members, wherein said second inject plate member is opposite said plug plate and comprises a consumable material.

23. An apparatus according to claim 22, wherein said consumable material is at least one from the group of materials consisting of silicon, silicon carbide and quartz.

24. An apparatus according to claim 2, wherein said plug plate comprises multiple independently movable sections.

25. An apparatus according to claim 24, wherein said multiple plug plate sections are concentrically arranged.

26. An apparatus according to claim 25, wherein said multiple plug plate sections are further divided into azimuthal sections.

27. An apparatus according to claim 9, wherein said plug plate comprises multiple independently movable sections corresponding to respective said multiple sections of said plenum.

28. An apparatus according to claim 2, wherein each of said nozzle plugs is connected to said back plate by a displacement actuator so as to provide for independent movement of each of said nozzle plugs.

29. An apparatus according to claim 2, wherein each said adjustable nozzle unit includes an annular-shaped throat.

30. An apparatus according to claim 2, wherein said nozzle units are adjustable so as to provide a flow of gas therethrough that is adjustable between a pressure-matched condition, an under-expanded condition and an over-expanded condition.

31. An apparatus according to claim 1, wherein said nozzle units include a throat region that has an associated throat area, wherein said nozzle units are adjustable so as to provide a change in said throat area.

32. An apparatus according to claim 1, wherein said nozzle units include an exit region that has an associated exit area, wherein said nozzle units are adjustable so as to provide a change in said exit area.

33. An apparatus according to claim 1, wherein said nozzle units include a throat region having a throat area and an exit region having an exit area, wherein said nozzle units are adjustable so as to provide a change in said throat area and said exit area.

34. An apparatus according to claim 1, wherein said nozzle units are adjustable so as to provide a change in the ratio of the pressure in the pressurizable plenum to the pressure in the vacuum chamber.

35. An apparatus according to claim 1, wherein said nozzle units are adjustable so as to provide a change in the ratio of the pressure in said pressurizable plenum to the pressure at said nozzle exit region.

36. An apparatus according to claim 2, wherein at least one of said nozzle plugs has a lower portion closest to said plug plate, and an upper portion opposite said lower portion, wherein said lower portion is outwardly tapered and said upper portion is inwardly tapered.

37. An apparatus according to claim 36, wherein said lower portion taper is one of linear and non-linear.

38. An apparatus according to claim 36, wherein said upper portion taper is one of linear and non-linear.

39. An apparatus according to claim 36, wherein said bore is cylindrical and is inwardly tapered toward said gas exit end.

40. An apparatus according to claim 36 wherein said nozzle plug further includes a tip capable of extending beyond said inject plate lower surface.

41. An apparatus according to claim 40, wherein said tip has a flat portion.

42. An apparatus according to claim 29, wherein said gas exit region has an associated gas exit area, and said annular throat has an associated throat area, and wherein the ratio of said gas exit area to said throat area is independent of the adjustment of said nozzle unit.

43. An apparatus according to claim 2, wherein at least one of said nozzle plugs has a lower portion closest to said plug plate, and an upper portion opposite said lower portion, wherein said lower plug portion is cylindrical and said upper plug portion is inwardly tapered, and wherein said bore is cylindrical except for a sharp inward taper at said inject plate lower surface.

44. An apparatus according to claim 43, wherein said taper of said nozzle plug and said taper of said bore are non-linear and smoothly varying.

45. An apparatus according to claim 2, wherein at least one of said nozzle plugs is outwardly tapered, and said bore is outwardly tapered.

46. An apparatus according to claim 45, wherein said bore taper is greater than or equal to said nozzle plug taper.

47. An apparatus of claim 29, wherein said nozzle throat is located at one of said gas entrance end and said gas exit end.

48. An apparatus according to claim 29, wherein said nozzle throat is located between said gas entrance end and said gas exit end.

49. An apparatus according to claim 2, wherein the spatial distribution of nozzle units varies across the gas injection manifold.

* * * * *